US012622074B2

(12) United States Patent
Lee et al.

(10) Patent No.: US 12,622,074 B2
(45) Date of Patent: May 5, 2026

(54) IMAGE SENSOR INCLUDING AN IMPURITY INJECTION REGION ON A BOTTOM SURFACE OF A TRENCH AND IMAGE SENSING SYSTEM INCLUDING THE IMAGE SENSOR

(71) Applicant: SAMSUNG ELECTRONICS CO., LTD., Suwon-si (KR)

(72) Inventors: Chan hee Lee, Yongin-si (KR); Kyung Ho Lee, Suwon-si (KR); Seung Ki Baek, Suwon-si (KR); Seung Ki Jung, Bucheon-si (KR); Tae Sub Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 987 days.

(21) Appl. No.: 17/539,277

(22) Filed: Dec. 1, 2021

(65) Prior Publication Data

US 2022/0328554 A1      Oct. 13, 2022

(30) Foreign Application Priority Data

Apr. 12, 2021    (KR) ........................ 10-2021-0047140

(51) Int. Cl.
*H10F 39/18*          (2025.01)
*H10F 39/00*          (2025.01)
(52) U.S. Cl.
CPC ........... *H10F 39/18* (2025.01); *H10F 39/014* (2025.01); *H10F 39/802* (2025.01); *H10F 39/807* (2025.01)

(58) Field of Classification Search
CPC ...... H10F 39/18; H10F 39/807; H10F 39/802; H10F 39/014
See application file for complete search history.

(56) References Cited

U.S. PATENT DOCUMENTS

| | | | |
|---|---|---|---|
| 6,787,386 B2 | 9/2004 | Park | |
| 9,704,909 B2 | 7/2017 | Kaneda | |
| 2014/0239362 A1* | 8/2014 | Koo .................... | H10F 39/8037 257/294 |
| 2016/0035774 A1* | 2/2016 | Noh ..................... | H10F 39/014 257/229 |

(Continued)

FOREIGN PATENT DOCUMENTS

| | | |
|---|---|---|
| JP | 2013-211295 A | 10/2013 |
| JP | 2017-152470 A | 8/2017 |

(Continued)

*Primary Examiner* — Norman D Richards
*Assistant Examiner* — Sean Ayers Winters
(74) *Attorney, Agent, or Firm* — Muir Patent Law, PLLC

(57) ABSTRACT

An image sensor includes a semiconductor substrate having a first surface and a second surface opposing the first surface, a photodiode layer in the semiconductor substrate, a transfer gate on the photodiode layer, the transfer gate being on the first surface of the semiconductor substrate, a first trench recessed from the first surface of the semiconductor substrate at one side of the transfer gate, a first impurity injection region on at least a portion of a bottom surface of the first trench, the first impurity injection region not being on a sidewall of the first trench, and a lens on the second surface of the semiconductor substrate.

20 Claims, 17 Drawing Sheets

(56) References Cited

U.S. PATENT DOCUMENTS

| | | | | |
|---|---|---|---|---|
| 2016/0056198 A1* | 2/2016 | Lee | .................... | H10F 39/807 |
| | | | | 257/225 |
| 2018/0182806 A1* | 6/2018 | Jin | .................... | H10F 39/805 |
| 2019/0109170 A1* | 4/2019 | Ihara | .................... | H10F 39/18 |
| 2020/0111821 A1* | 4/2020 | Hong | .................... | H10F 39/024 |
| 2020/0393549 A1* | 12/2020 | Jin | .................... | H10F 30/2863 |

FOREIGN PATENT DOCUMENTS

| | | | |
|---|---|---|---|
| JP | 2018-182327 | A | 11/2018 |
| KR | 10-1387008 | B1 | 4/2014 |
| KR | 10-2014-0113633 | A | 9/2014 |
| KR | 10-2016-0078613 | A | 7/2016 |
| KR | 10-2017-0049336 | A | 5/2017 |
| KR | 10-2019-0120116 | A | 10/2019 |

* cited by examiner

IMAGE SENSOR INCLUDING AN IMPURITY INJECTION REGION ON A BOTTOM SURFACE OF A TRENCH AND IMAGE SENSING SYSTEM INCLUDING THE IMAGE SENSOR

CROSS-REFERENCE TO RELATED APPLICATION

This application claims priority from Korean Patent Application No. 10-2021-0047140 filed on Apr. 12, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to an image sensor and an image sensing system including the image sensor.

2. Description of the Related Art

An image sensing device is a semiconductor element that converts optical information into an electrical signal. For example, the image sensing device may include a charge coupled device (CCD) image sensing device and a complementary metal-oxide semiconductor (CMOS) image sensing device.

The CMOS image sensor may be abbreviated as a CIS (CMOS image sensor). The CIS may include a plurality of pixels arranged two-dimensionally. Each of the pixels may include, e.g., a photodiode (PD) layer. The photodiode layer may serve to convert incident light into an electrical signal.

SUMMARY

According to some embodiments, an image sensor may include a semiconductor substrate having a first surface and a second surface opposing the first surface, a photodiode layer in the semiconductor substrate, a transfer gate disposed on the photodiode layer and disposed on the first surface of the semiconductor substrate, a first trench recessed from the first surface of the semiconductor substrate at one side of the transfer gate, a first impurity injection region formed on at least a portion of a bottom surface of the first trench and not formed on a sidewall of the first trench and a lens disposed on the second surface of the semiconductor substrate.

According to some embodiments, an image sensor may also include a semiconductor substrate having a first surface and a second surface opposing the first surface, a photodiode layer in the semiconductor substrate, a first trench disposed on the photodiode layer and recessed from the first surface of the semiconductor substrate, a transfer gate filling the first trench, a second trench spaced apart from the first trench and recessed from the first surface of the semiconductor substrate, at one side of the transfer gate, a first impurity injection region formed on at least a portion of a bottom surface of the second trench and a lens disposed on the second surface of the semiconductor substrate, wherein a first depth of the first trench is greater than a second depth of the second trench.

According to some embodiments, an image sensing system may include an image sensor outputting an image signal and an image signal processor connected with the image sensor, processing the image signal provided from the image sensor, wherein the image sensor includes a semiconductor substrate including a first surface and a second surface opposing the first surface, a photodiode layer in the semiconductor substrate, a first trench disposed on the photodiode layer and recessed from the first surface of the semiconductor substrate, a transfer gate filling the first trench, a second trench spaced apart from the first trench and recessed from the first surface, at one side of the transfer gate, a first impurity injection region formed on at least a portion of a bottom surface of the second trench and not formed on a sidewall of the second trench and a lens disposed on the second surface of the semiconductor substrate, wherein a first depth of the first trench is greater than a second depth of the second trench.

BRIEF DESCRIPTION OF THE DRAWINGS

Features will become apparent to those of skill in the art by describing in detail exemplary embodiments with reference to the attached drawings, in which:

FIG. 4 is a view of a sensor array region according to some embodiments of the present disclosure;

DETAILED DESCRIPTION

Figure 1:
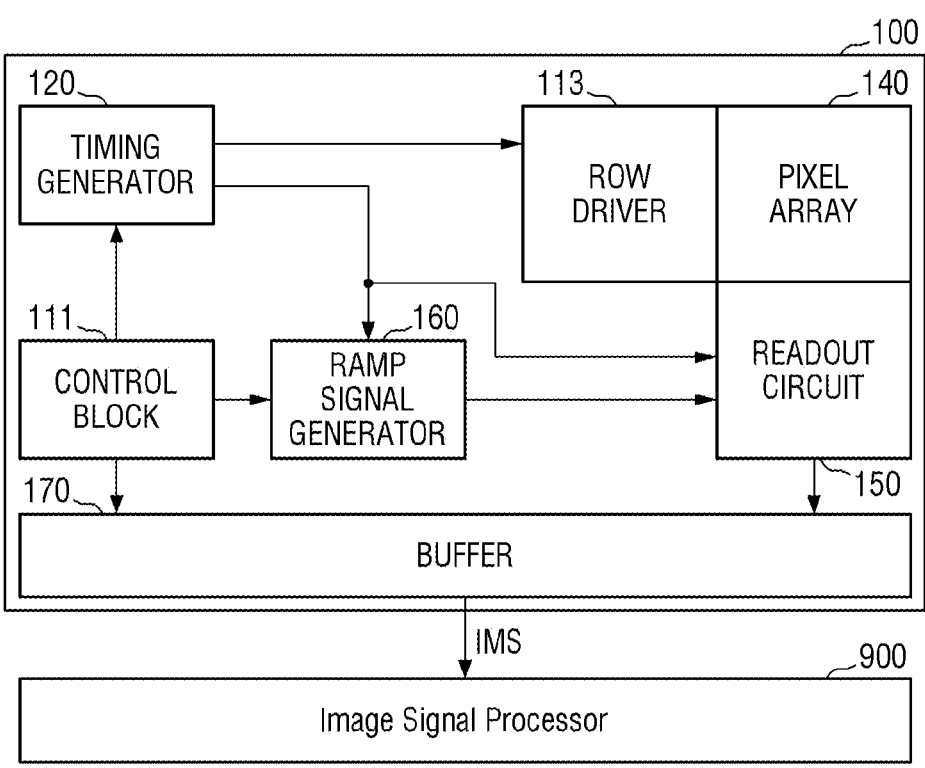
FIG. 1 is a block diagram of an image sensing system according to some embodiments of the present disclosure.

FIG. 1 is a block diagram of an image sensing system according to some embodiments of the present disclosure.

Referring to FIG. 1, an image sensing system 1 may include an image sensor 100 and an image signal processor 900.

The image sensor 100 may generate an image signal IMS by sensing an image of a sensing target using light. In some embodiments, the generated image signal IMS may be a digital signal, but embodiments are not limited thereto. The image signal IMS may be provided to the image signal processor 900 and then processed by the image signal processor 900. The image signal processor 900 may receive the image signal IMS output from a buffer 170 of the image sensor 100 and process the received image signal IMS to be easily displayed.

In some embodiments, the image signal processor 900 may perform digital binning for the image signal IMS output from the image sensor 100. At this time, the image signal IMS output from the image sensor 100 may be a raw image signal from a pixel array 140 without analog binning, or may be an image signal IMS for which analog binning has been already performed.

In some embodiments, the image sensor 100 and the image signal processor 900 may be disposed to be detached from each other as shown. For example, the image sensor 100 may be embedded in a first chip, and the image signal processor 900 may be embedded in a second chip, whereby the image sensor 100 and the image signal processor 900 may perform communication with each other through a predetermined interface. However, embodiments are not limited to this example, and the image sensor 100 and the image signal processor 900 may be implemented in one package, e.g., a multi-chip package (MCP).

The image sensor 100 may include a control block 111, a timing generator 120, a row driver 113, the pixel array 140, a readout circuit 150, a ramp signal generator 160, and the buffer 170.

The control block 111, i.e., a control register block, may control overall operations of the image sensor 100. Particularly, the control block 111 may directly transmit an operation signal to the timing generator 120, the ramp signal generator 160, and the buffer 170.

The timing generator 120 may generate a reference signal that becomes a reference of an operation timing of various elements of the image sensor 100. The operation timing reference signal generated by the timing generator 120 may be transferred to the row driver 113, the readout circuit 150, the ramp signal generator 160, etc.

The ramp signal generator 160 may generate and transmit a ramp signal used in the readout circuit 150. For example, the readout circuit 150 may include a correlation double sampler (CDS), a comparator, etc. The ramp signal generator 160 may generate and transmit a ramp signal used in the correlation double sampler (CDS), the comparator, etc.

The buffer 170 may include, e.g., a latch. The buffer 170 may temporarily store the image signal IMS that will be provided to the outside, and may transmit the image signal IMS to an external memory or an external device.

The pixel array 140 may sense an external image. The pixel array 140 may include a plurality of pixels (or unit pixel). The row driver 113 may selectively enable rows of the pixel array 140.

The readout circuit 150 may sample the pixel signal provided from the pixel array 140, compare the sampled pixel signal with the ramp signal and then convert an analog image signal (data) into a data image signal (data) based on the compared result.

Figure 2:
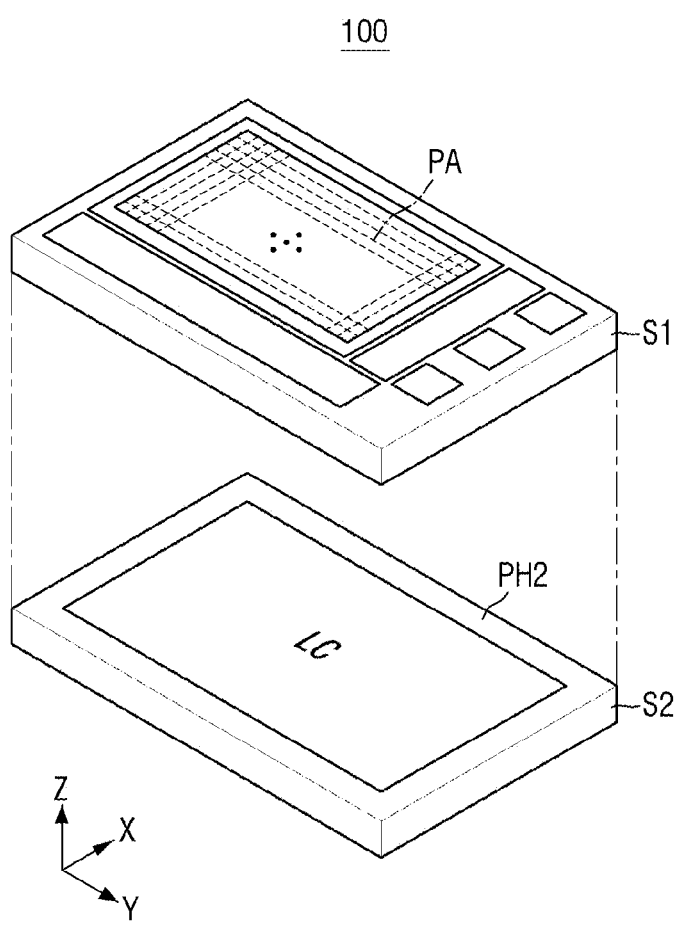
FIG. 2 is a conceptual layout diagram of an image sensor of FIG. 1.
Figure 3:
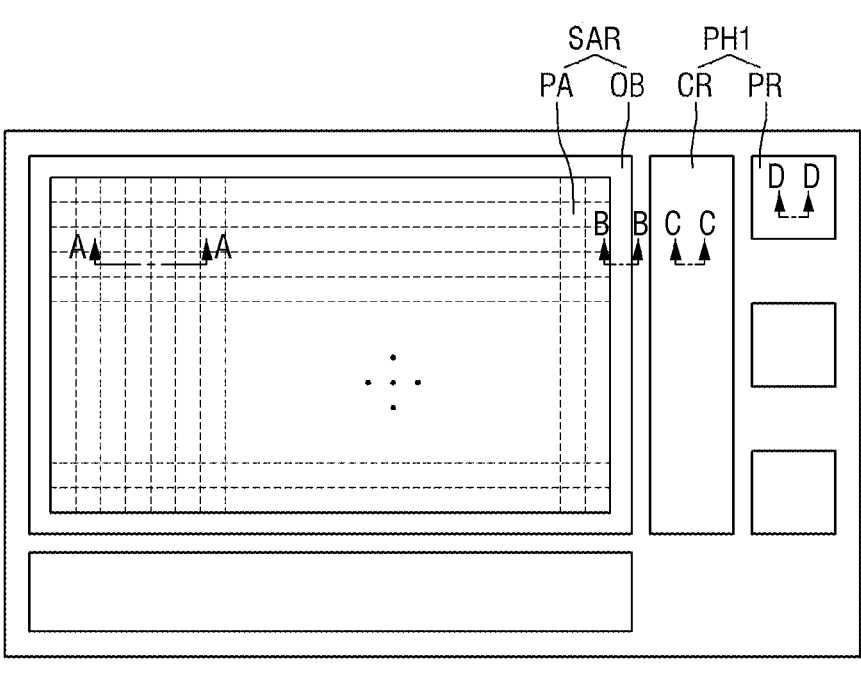
FIG. 3 is a plan view of the image sensor layout of FIG. 2.

FIG. 2 is an exploded view of a conceptual layout of the image sensor 100 of FIG. 1, and FIG. 3 is a top plan view of the image sensor 100 of FIG. 2. FIG. 3 illustrates a detailed top view of a first region S1 of the image sensor 100.

Referring to FIGS. 2 and 3, the image sensor 100 may include the first region S1 and a second region S2, which are deposited, e.g., arranged to overlap, in a third direction Z. The first region S1 and the second region S2 may be extended in a first direction X and a second direction Y, which cross the third direction Z, and blocks shown in FIG. 1 may be disposed in the first region S1 and the second region S2.

Although not shown, a third region in which a memory is disposed may be disposed below the second region S2. At this time, the memory disposed in the third region may store or process image data transmitted from the first region S1 and the second region S2, and may retransmit the image data to the first region S1 and the second region S2. In this case, the memory may include a memory device, e.g., a dynamic random access memory (DRAM) device, a static random access memory (SRAM) device, a spin transfer torque magnetic random access memory (STT-MRAM) device and a flash memory device. When the memory includes, e.g., a DRAM device, the memory may receive image data at a relatively high speed and process the received image data. Also, in some embodiments, the memory may be disposed in the second region S2.

As illustrated in FIG. 3, the first region S1 may include a sensor array region SAR and a first peripheral region PH1, and the second region S2 may include a logic circuit region LC and a second peripheral region PH2. The first region S1 and the second region S2 may be disposed to be deposited up and down in due order.

In the first region S1, the sensor array region SAR may include an active pixel sensor array, i.e., a pixel array region PA. The pixel array region PA may correspond to the pixel array 140 of FIG. 1. For example, a plurality of pixels may be arranged two-dimensionally (e.g., in the X and Y directions in the form of matrix) in the pixel array region PA of the sensor array region SAR.

The sensor array region SAR may include a light-receiving region, i.e., the pixel array region PA, and a light-shielding region OB. The pixel array region PA for generating an active signal by receiving light may be arranged in the light-receiving region. Optical black pixels for generating an optical black signal by shielding light may be arranged in the light-shielding region OB. For example, the light-shielding region OB may be formed along the periphery, e.g., along an entire perimeter, of the light-receiving region, e.g., of the pixel array region PA, but this is only exemplary. In some embodiments, dummy pixels may be formed in the light-receiving region, e.g., in the pixel array region PA, adjacent to the light-shielding region OB.

The first peripheral region PH1 may include a connection region CR and a pad region PR. The connection region CR may be formed in the periphery of the sensor array region SAR. The connection region CR may be formed at one side of the sensor array region SAR, but this is only exemplary. Lines may be formed in the connection region CR and configured to transmit and receive electrical signals of the sensor array region SAR.

The pad region PR may be formed in the periphery of the sensor array region SAR. The pad region PR may be formed to be adjacent to an edge of the image sensor 100 according to some embodiments, but this is only exemplary. The pad region PR may be connected with an external device, etc., and may be configured to transmit and receive electrical signals between the image sensor 100 and the external device.

In the second region S2, the logic circuit region LC may include electronic devices that include a plurality of transistors. The electronic devices included in the logic circuit region LC may be electrically connected with the pixel array region PA in the sensor array region SAR to provide a certain signal to each pixel of the active pixel sensor array or control an output signal.

In the logic circuit region LC, e.g., the control block 111, the timing generator 120, the row driver 113, the readout circuit 150, the ramp signal generator 160, the buffer 170, etc., which are described with reference to FIG. 1, may be disposed. In the logic circuit region LC, e.g., blocks except the pixel array 140 (active pixel sensor array), among the blocks of FIG. 1 may be disposed. Although the second peripheral region PH2 corresponding to the first peripheral region PH1 of the first region S1 may also be disposed in the second region S2, the embodiments are not limited thereto.

Figure 4:
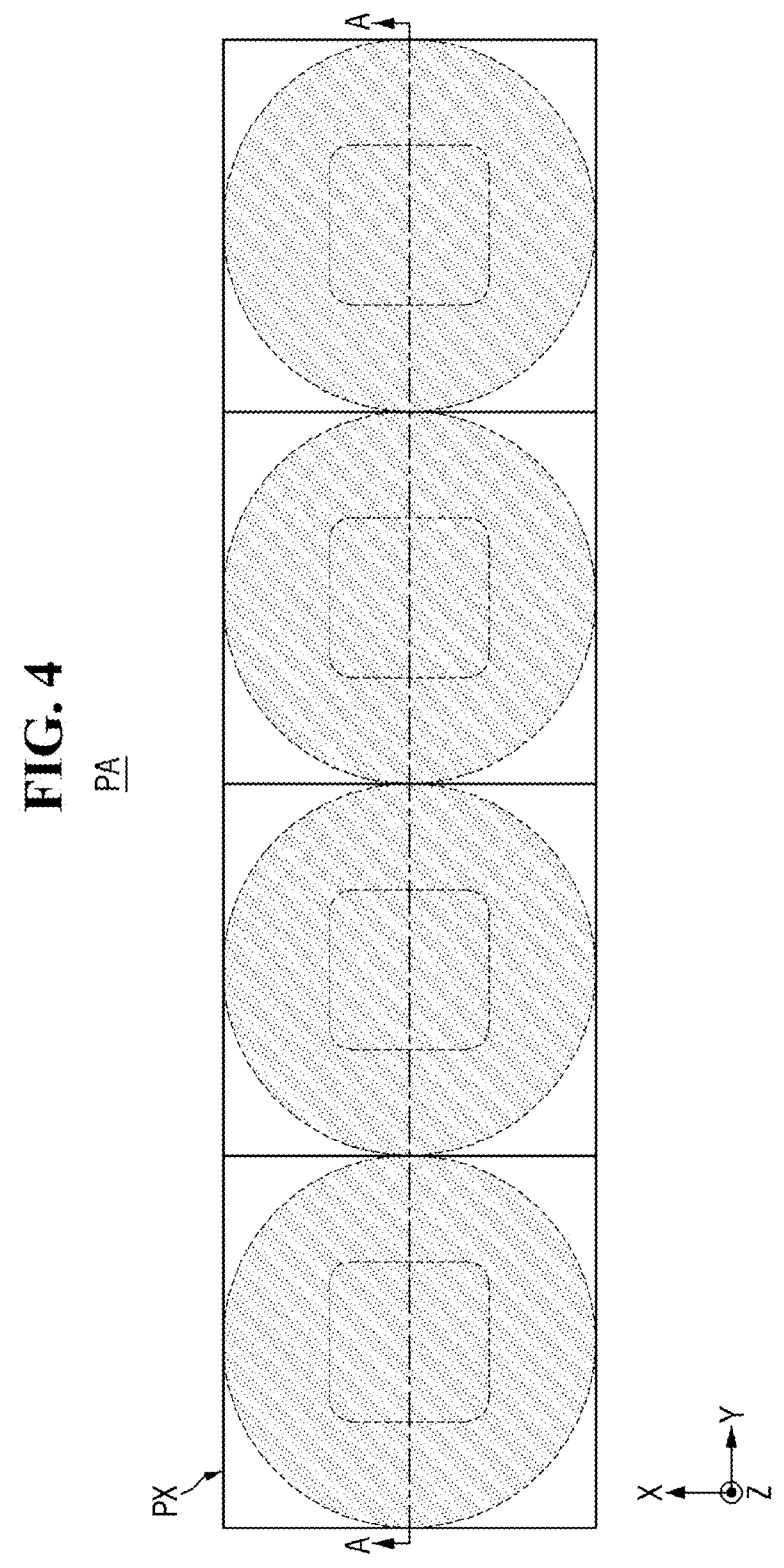

FIG. 4 is a partial view of the sensor array region SAR according to some embodiments of the present disclosure.

Referring to FIG. 4, the pixel array region PA may include a plurality of pixels PX. In this case, the pixel array region PA may be included in the image sensor 100. For example, the pixel array region PA may be the pixel array region PA of FIG. 3, e.g., the pixel array 140 of FIG. 1. Also, one pixel PX may be a unit pixel included in the pixel array region PA, e.g., a pixel PX and a unit pixel may be used interchangeably hereinafter. For example, the plurality of pixels PX may be disposed at certain intervals along the first direction X and the second direction Y. However, embodiments are not limited to this example.

FIG. 4 illustrates a portion of the pixel array region PA of FIG. 3, which is viewed in a top plan view (e.g., an opposite direction of the third direction Z). FIG. 4 illustrates a schematic layout of four pixels PX from the pixel array region PA along line A-A of FIG. 3. The plurality of pixels PX in the sensor array region SAR of FIG. 3 may be regularly arranged along the first direction X and the second direction Y.

Figure 5:
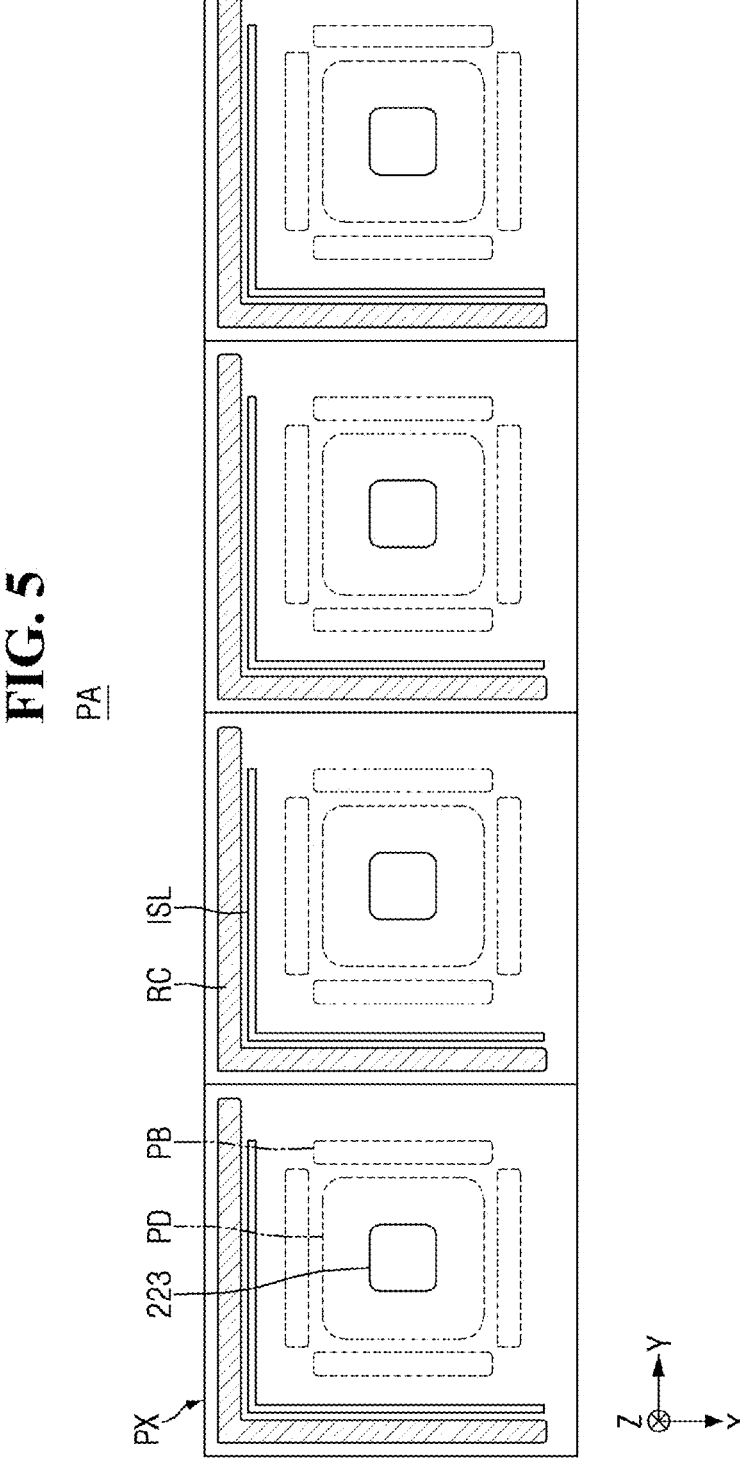
FIG. 5 is a layout of a pixel array region according to some embodiments.
Figure 6:
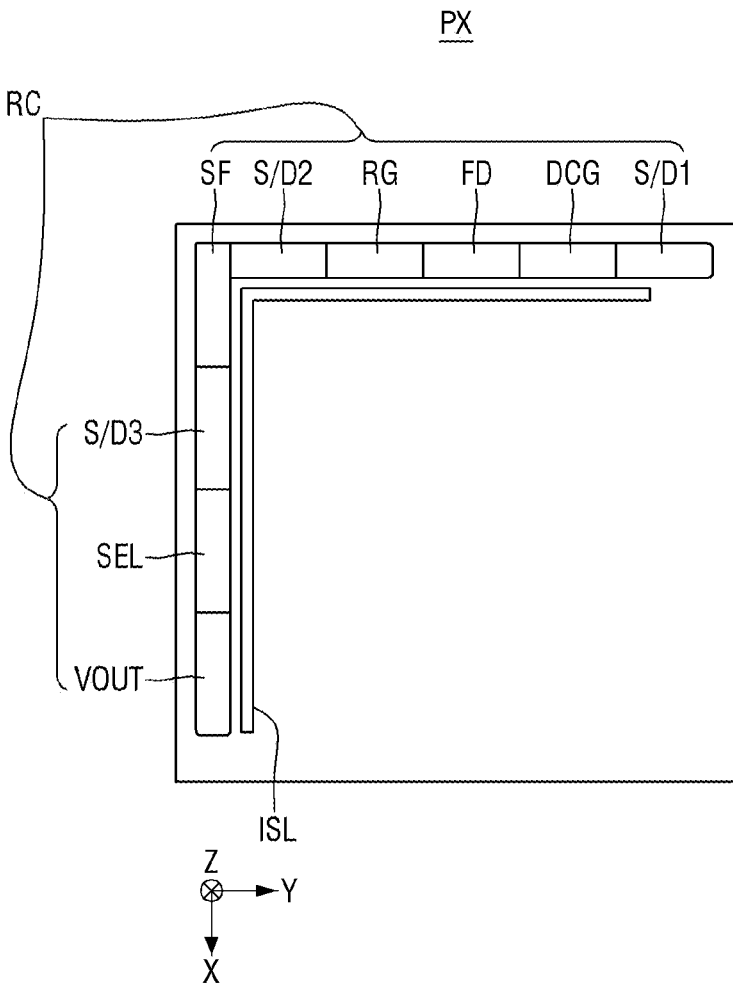
FIG. 6 is a layout of a pixel array region according to some embodiments.
Figure 7:
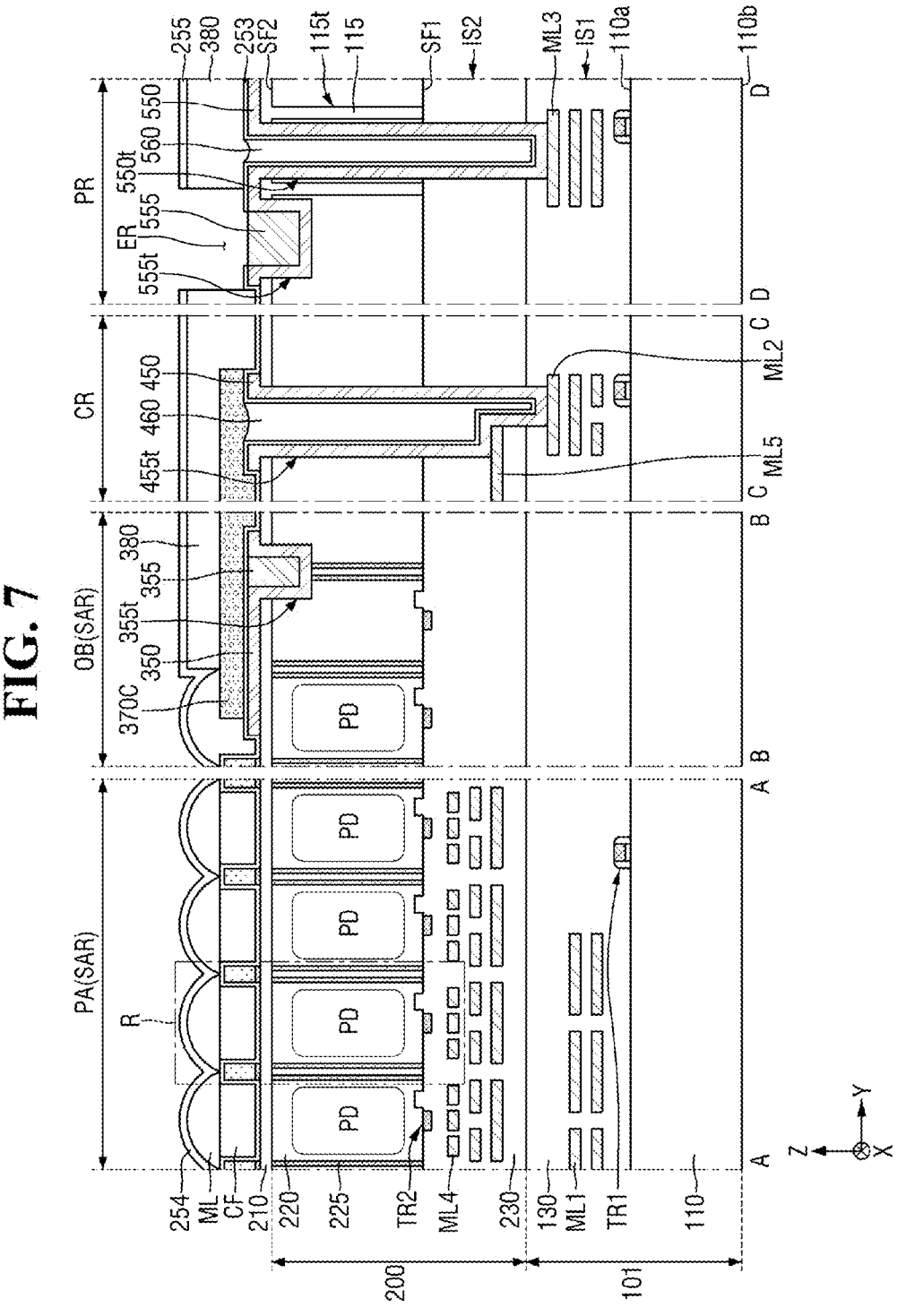
FIG. 7 illustrates cross-sectional views along lines A-A, B-B, C-C and D-D of FIG. 3.
Figure 8:
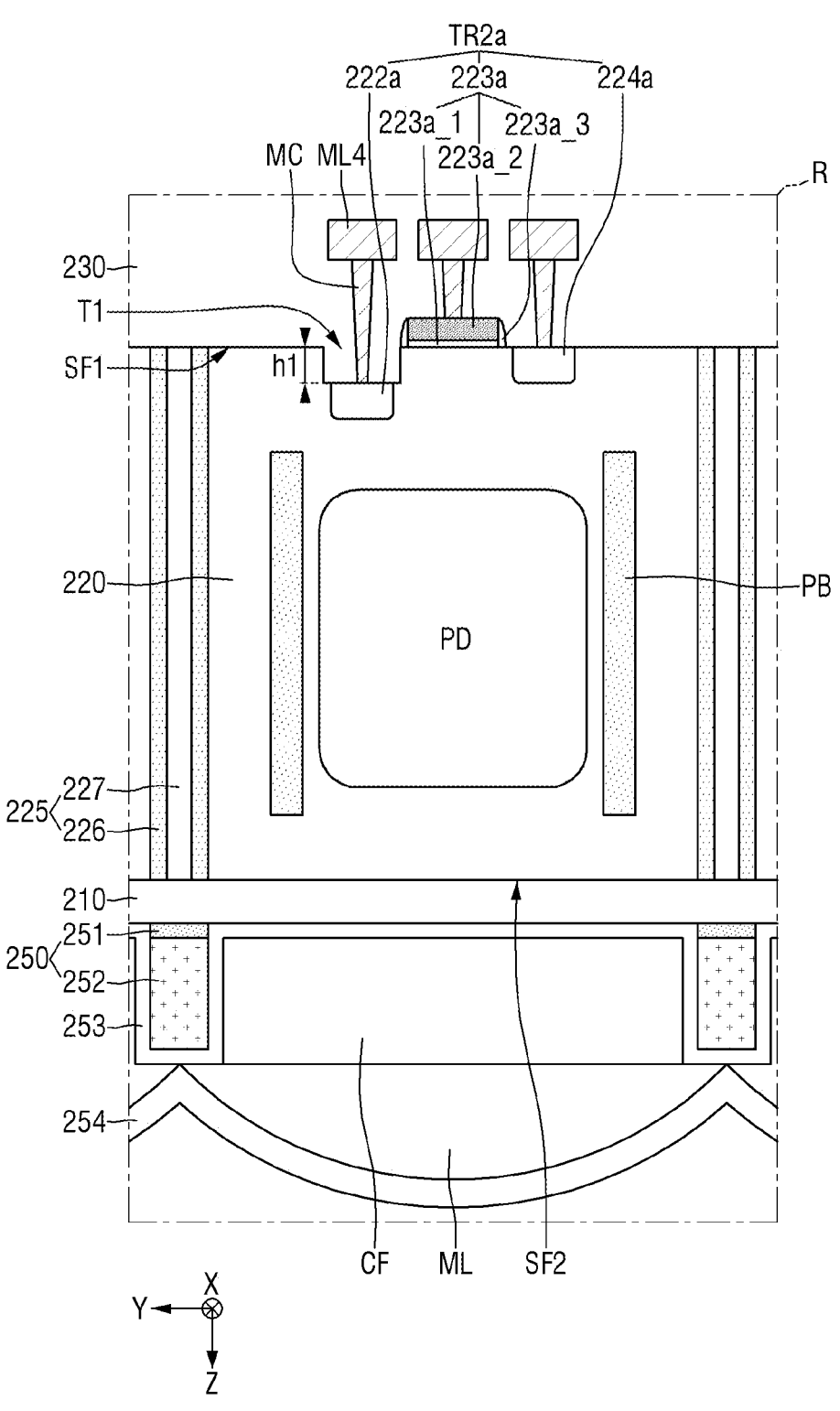
FIG. 8 is an enlarged view of region R of FIG. 7.

FIG. 5 is a detailed layout of the pixel array region PA of FIG. 4, and FIG. 6 is a detailed layout of a single pixel in the pixel array region PA. FIG. 7 illustrates cross-sectional views along lines A-A, B-B, C-C and D-D of FIG. 3, and FIG. 8 is an enlarged view of region R of FIG. 7. It is noted that region R in FIG. 8 is inverted relative to FIG. 7.

Referring to FIGS. 5 to 8, the image sensor according to some embodiments may include a first semiconductor substrate 110, a first line structure IS1, a second semiconductor substrate 220, a second line structure IS2, a surface insulating layer 210, a grid pattern 250, a color filter CF, and a micro lens ML.

The first semiconductor substrate 110 may be a bulk silicon or silicon-on-insulator (SOI). The first semiconductor substrate 110 may be a silicon substrate, or may include another material, e.g., silicon germanium, indium antimonide, lead telluride, indium arsenide, indium compound, gallium arsenide, and/or gallium antimonide. The first semiconductor substrate 110 may be an epi-layer formed on a base substrate.

The first semiconductor substrate 110 may include a first surface 110a and a second surface 110b, which are opposite to each other. In some embodiments, the first surface 110a of the first semiconductor substrate 110 may be a surface opposing a third surface SF1 of the second semiconductor substrate 220.

A plurality of electronic devices may be formed on the first semiconductor substrate 110. For example, a first electronic device TR1 may be formed on the first surface 110a of the first semiconductor substrate 110. The first electronic device TR1 may be electrically connected with a sensor array region SAR to transmit and receive an electrical signal to and from each pixel of the sensor array region SAR. For example, the first electronic device TR1 may include electronic devices that constitute the control block 111, the timing generator 112, the row driver 113, the pixel array 140, the readout circuit 150, the ramp signal generator 160, and the buffer 170 of FIG. 1.

The first line structure IS1 may be formed on the first semiconductor substrate 110. For example, the first line structure IS1 may cover the first surface 110a of the first semiconductor substrate 110. The first semiconductor substrate 110 and the first line structure IS1 may constitute a first substrate structure 101.

The first line structure IS1 may be attached to the second line structure IS2. For example, as shown in FIG. 7, an upper surface of the first line structure IS1 may be attached to a bottom surface of the second line structure IS2. For example, a bottom surface of the first line structure IS1 may be attached to the first surface 110a of the first semiconductor substrate 110.

The first line structure IS1 may include one or more lines. For example, the first line structure IS1 may include a first inter-line insulating film 130, and a plurality of lines ML1, ML2 and ML3 in the first inter-line insulating film 130. The number of layers of lines constituting the first line structure IS1 and their arrangement are only exemplary in FIG. 7, and are not limited thereto. The first inter-line insulating film 130 may include, e.g., at least one of silicon oxide, silicon nitride, silicon oxynitride or a low dielectric (low-k) material having a dielectric constant lower than that of silicon oxide, but is not limited thereto. In some embodiments, the first line structure IS1 may include the same material as that of the second line structure IS2.

At least a portion of the lines ML1, ML2 and ML3 of the first line structure IS1 may be connected with the first electronic device TR1. In some embodiments, the first line structure IS1 may include a first line ML1 in the sensor array region SAR, a second line ML2 in the connection region CR, and a third line ML3 in the pad region PR. In some embodiments, the second line ML2 may be the uppermost line of the plurality of lines in the connection region CR, and the third line ML3 may be the uppermost line of the plurality of lines in the pad region PR. The first line ML1, the second line ML2 and the third line ML3 may include, e.g., at least one of W, Cu, Al, Au, Ag or their alloy, but are not limited thereto.

The second semiconductor substrate 220 may be a semiconductor substrate. For example, the second semiconductor substrate 220 may be a bulk silicon or silicon-on-insulator (SOI). The second semiconductor substrate 220 may be a silicon substrate, or may include another material, e.g., a semiconductor material that includes silicon germanium, indium antimonide, lead telluride, indium arsenide, indium compound, gallium arsenide, and/or gallium antimonide. The second semiconductor substrate 220 may be an epi-layer formed on a base substrate.

The second semiconductor substrate 220 may include a third surface SF1 and a fourth surface SF2, which are opposite to each other. In the embodiments, which will be described later, the third surface SF1 may be referred to as a front side of the second semiconductor substrate 220, and the fourth surface SF2 may be referred to as a back side of the second semiconductor substrate 220. In some embodiments, the fourth surface SF2 of the second semiconductor substrate 220 may be a light-receiving surface where light enters. That is, the image sensor according to some embodiments may be a back side irradiation (BSI) image sensor.

A plurality of pixels PX may be formed on the second semiconductor substrate 220 of the sensor array region SAR.

The micro lenses ML and color filters CF may be disposed on each of the plurality of pixels PX. Although a micro lens of a normal pixel is shown, embodiments are not limited thereto, e.g., a super PD lens may be disposed on the plurality of pixels PX.

For example, one pixel PX may include a portion of the second semiconductor substrate 220, a photodiode layer PD, a second transistor TR2, and a pixel separation pattern 225. In some embodiments, the second transistor TR2 may be disposed on the third surface SF1 of the second semiconductor substrate 220.

The second transistor TR2 may include, e.g., at least a portion of various transistors (e.g., a transmission transistor, a reset transistor, a source follower transistor, a selection transistor, and the like) constituting the pixel PX of the image sensor. For example, in the present disclosure, a description will be given based on that the second transistor TR2 is a transmission transistor of the image sensor 100.

In detail, referring to FIG. 8, the second transistor TR2 (hereinafter referred to as a "second transistor TR2a") may include a first impurity injection region 222a, a transfer gate structure 223a, and a second impurity injection region 224a. The first impurity injection region 222a is formed at one side of the transfer gate structure 223a and formed on at least a portion of a bottom surface of a first trench T1 recessed along the third surface SF1. For example, as illustrated in FIG. 8, the first impurity injection region 222a may be formed at the bottom surface the first trench T1, e.g., the bottom of the first trench T1 may completely overlap the top of the first impurity injection region 222a.

The first impurity injection region 222a is disposed at a first depth h1 based on, e.g., relative to, the uppermost surface of the third surface SF1, and the first depth h1 of the first trench T1 ranges from about 0.1 μm to about 0.2 μm. The first impurity injection region 222a is not formed at a sidewall of the first trench T1. Therefore, a semiconductor material which is not doped with impurities is disposed between the first impurity injection region 222a and, e.g., a bottom of, the transfer gate structure 223a.

For example, P type impurities may be doped in the second semiconductor substrate 220 through the first impurity injection region 222a. The P type impurities include group-III elements, e.g., boron (B). The first impurity injection region 222a may be connected with a ground terminal and then grounded when the image sensor 100 operates.

A distance between the first impurity injection region 222a and the transfer gate structure 223a may be increased through the above arrangement of the first trench T1 and the first impurity injection region 222a, e.g., due to the first impurity injection region 222a being at a predetermined depth relative to the bottom of the transfer gate structure 223. Therefore, a magnitude of an electric field (E-field) between the first impurity injection region 222a and the transfer gate structure 223a is reduced by the increased distance. The reduced electric field may prevent a white spot caused by a high electric field between the first impurity injection region 222a and the transfer gate structure 223a from occurring. Therefore, even though a pitch of a pixel, e.g., a distance between adjacent pixels, is reduced, the magnitude of the electric field (E-field) may be reduced, thereby preventing or substantially minimizing degradation, e.g., occurrence of a white spot.

The transfer gate structure 223a may include a transfer gate insulating film 223a_1, a transfer gate electrode 223a_2, and transfer gate spacers 223a_3. The transfer gate insulating film 223a_1 may be formed in a flat shape along the uppermost surface of the third surface SF1 of the second semiconductor substrate 220. The transfer gate electrode 223a_2 may be disposed on the transfer gate insulating film 223a_1, and is disposed in a space defined between the transfer gate spacers 223a_3. In this case, the transfer gate electrode 223a_2 may serve as a gate of the second transistor TR2a, and a high voltage may be applied to the transfer gate electrode 223a_2 while the first impurity injection region 222a is being grounded when the image sensor 100 operates.

The second impurity injection region 224a may be formed on the uppermost surface of the third surface SF1, and n type impurities may be doped in the second semiconductor substrate 220. The n type impurities include group-V elements, e.g., arsenic (As) and phosphorous (P). The second impurity injection region 224a may serve as source/drain of the second transistor TR2a. For example, the second impurity injection region 224a may correspond to a floating diffusion.

The pixel separation pattern 225 may be disposed in the second semiconductor substrate 220. The pixel separation pattern 225 may define the plurality of pixels PX. The pixels PX may be disposed to be two-dimensional in a top plan view. For example, the pixel separation pattern 225 may be formed in a grid pattern in a top plan view, so the pixels PX may be spaced apart from each other in two directions via the grid pattern of the pixel separation pattern 225. The pixel separation pattern 225 may be formed in such a manner that an insulating material is buried in a deep trench formed as the second semiconductor substrate 220 is patterned.

In some embodiments, the pixel separation pattern 225 may include an insulating spacer film 226 and a conductive filling pattern 227. The insulating spacer film 226 may be extended to be conformal along a side of the trench in the second semiconductor substrate 220.

The pixel PX may include the photodiode layer PD. The photodiode layer PD may be formed in the second semiconductor substrate 220. The photodiode layer PD may generate charges in proportion to the amount of external incident light. The photodiode layer PD may be formed by doping impurities into the second semiconductor substrate 220. For example, when the second semiconductor substrate 220 is doped with P type impurities, the photodiode layer PD may be doped with N type impurities. That is, a type of impurities doped in the second semiconductor substrate 220 may be different from that of impurities doped in the photodiode layer PD.

In some embodiments, the pixel PX may include the surface insulating layer 210, the grid pattern 250, a first liner 253, the color filter CF, the micro lens ML, and a second liner 254.

The surface insulating layer 210 may be deposited on the fourth surface SF2 of the second semiconductor substrate 220. The grid pattern 250, the first liner 253, the color filter CF, the micro lens ML, and the second liner 254 may be disposed in a region defined by the surface insulating layer 210.

The color filter CF may be formed on the surface insulating layer 210. The color filter CF may be arranged to correspond to each pixel PX, e.g., one-to-one correspondence. Each color filter CF may be arranged to be two-dimensional in a top plan view. The micro lens ML may be formed on the color filter CF. The micro lens ML may be arranged to correspond to each pixel PX, e.g., one-to-one correspondence. The micro lens ML may have a convex shape, and may have a predetermined curvature radius. Therefore, the micro lens ML may condense light entering the photodiode layer PD. For example, the micro lens ML may include a light-transmissive resin. In this case, the micro lens ML of each pixel PX may cover one surface of each pixel.

The grid pattern 250 may be formed between the color filters CF. The grid pattern 250 may be formed on the surface insulating layer 210. The grid pattern 250 may include, e.g., a metal pattern 251 and a low refractive index pattern 252. The metal pattern 251 and the low refractive index pattern 252 may be deposited on the surface insulating layer 210 in due order.

The first liner 253 may be formed on the surface insulating layer 210 and the grid pattern 250. The first liner 253 may be extended along surfaces of the surface insulating layer 210 and the grid pattern 250. The first liner 253 may include, e.g., an aluminum oxide.

The second liner 254 may be extended along a surface of the micro lines ML. For example, the second liner 254 may include an inorganic oxide film, e.g., silicon oxide, titanium oxide, zirconium oxide, hafnium oxide and their combination.

In some embodiments, the pixel PX may include a second inter-line insulating film 230 and a connection structure. The connection structure may be formed in the second inter-line insulating film 230. In this case, the connection structure may include a fourth line ML4 and a plurality of contacts MC in the sensor array region SAR. Elements of the pixel PX may be electrically connected with elements of the image sensor 100 through the connection structure.

In some embodiments, in the pixel PX, a P type barrier PB may be formed in the second semiconductor substrate 220. The P type barrier PB may be disposed to be spaced apart from the photodiode layer PD by a predetermined interval, e.g., along the Y-direction. For example, the P type barrier PB may be disposed in the periphery of the photodiode layer PD, or may, e.g., completely, surround the photodiode layer PD. For example, the P type barrier PB may be formed to be spaced apart from the photodiode layer PD in the first direction X and the second direction Y. Also, the P type barrier PB may be extended along the photodiode layer PD in the third direction Z. That is, the P type barrier PB may be formed to be vertical in the second semiconductor substrate 220. Unlike the photodiode layer PD doped with N type impurities, the P type barrier PB may be doped with P type impurities.

Also, the pixel PX of the pixel array region PA may include a storage diode, a storage gate, and the like disposed to be adjacent to the photodiode layer PD. Further, as illustrated in FIG. 5, the pixel PX may include a readout circuit RC and an insulating layer ISL. The readout circuit RC may be connected with the transistors TR1 and TR2, the impurity injection regions, and the storage gate through a line layer and the contacts MC. The readout circuit RC may be disposed in a region different from the region where the photodiode layer PD, the transistor TRs TR1 and TR2, the storage diode, and the storage gate are formed. That is, the readout circuit RC may be formed only in other region of the pixel PX, in which the other devices are not disposed. In this case, the readout circuit RC may be spaced apart from the other devices by the insulating layer ISL.

In detail, referring to FIG. 6, the pixel PX may include the readout circuit RC. For example, the readout circuit RC may include a floating diffusion FD, a double conversion gate DCG, first to third source drains S/D1, S/D2 and S/D3, a reset gate RG, a source follower transistor SF, and a selection transistor SEL. The readout circuit RC may be formed in a portion of the pixel PX in which the storage diode and the storage gate are not formed. Also, the readout circuit RC may be insulated from the other devices of the pixel PX by the insulating layer ISL. In this case, the floating diffusion FD may be connected to the transfer gate TG of the pixel PX, and charges formed from the photodiode layer PD may be transferred to the readout circuit RC. As a result, an output voltage VOUT may be output.

Referring to FIG. 7 again, the image sensor according to some embodiments may further include a first connection structure 350, a second connection structure 450 and a third connection structure 550.

The first connection structure 350 may be formed in the light-shielding region OB. A portion of the first connection structure 350 may be formed on the surface insulating layer 210 of the light-shielding region OB. The first connection structure 350 may be in contact with the pixel separation pattern 225. For example, a first trench 355t for exposing the pixel separation pattern 225 may be formed in the second semiconductor substrate 220 and the surface insulating layer 210 of the light-shielding region OB, and the first connection structure 350 may be f, e.g., conformally, formed in the first trench 355t and then in contact with the pixel separation pattern 225 of the light-shielding region OB. In some embodiments, the first connection structure 350 may be extended along a profile of a side and lower surface of the first trench 355t.

In some embodiments, the first connection structure 350 may be electrically connected with the pixel separation pattern 225 to apply a ground voltage or a negative voltage to the conductive filling pattern 227. Therefore, charges, e.g., generated by electrostatic discharge (ESD), may be emitted to the first connection structure 350 through the pixel separation pattern 225, and an ESD bruise defect may effectively be prevented from occurring. The first connection structure 350 may include a titanium (T1) film, a titanium nitride (TiN) film, and a tungsten (W) film, which are sequentially deposited in the first trench 355t.

In some embodiments, a first pad 355 filling the first trench 355t may be formed on the first connection structure 350. The first pad 355 may include, e.g., at least one of W, Cu, Al, Au, Ag or their alloy.

In some embodiments, the first liner 253 may cover the first connection structure 350 and the first pad 355. For example, the first liner 253 may be extended along a profile of the first connection structure 350 and the first pad 355.

The second connection structure 450 may be formed in the connection region CR. A portion of the second connection structure 450 may be formed on the surface insulating layer 210 of the connection region CR. The second connection structure 450 may electrically connect the first substrate structure 101 with a second substrate structure 200. For example, a second trench 455t for exposing the second line ML2 and a fifth line ML5 may be formed in the first substrate structure 101 and the second substrate structure 200 of the connection region CR. The second connection structure 450 may be formed in the second trench 455t to connect the second line ML2 with the fifth line ML5. In some embodiments, the second connection structure 450 may be extended along a profile of a side and a lower surface of the second trench 455t. In some embodiments, the second connection structure 450 may include a titanium (T1) film, a titanium nitride (TiN) film, and a tungsten (W) film, which are sequentially deposited in the second trench 455t.

In some embodiments, the first liner 253 may cover the second connection structure 450. For example, the first liner 253 may be extended along a profile of the second connection structure 450.

In some embodiments, a first filling insulating film 460 filling the second trench 455t may be formed on the second connection structure 450. The first filling insulating film 460 may include, e.g., at least one of silicon oxide, aluminum oxide, tantalum oxide or their combination.

The third connection structure 550 may be formed in the pad region PR. The third connection structure 550 may be formed on the surface insulating layer 210 of the pad region PR. The third connection structure 550 may electrically connect the first substrate structure 101 with an external device, etc.

For example, a third trench 550t for exposing the third line ML3 may be formed in the first substrate structure 101 and the second substrate structure 200 of the pad region PR. The third connection structure 550 may be formed in the third trench 550t to be in contact with the third line ML3.

Also, a fourth trench 555t may be formed in the second semiconductor substrate 220 of the pad region PR. The third connection structure 550 may be formed in the fourth trench 555t and then exposed. In some embodiments, the third connection structure 550 may be extended along a profile of sides and lower surfaces of the third trench 550t and the fourth trench 555t. In some embodiments, the third connection structure 550 may include a titanium (T1) film, a titanium nitride (TiN) film and a tungsten (W) film, which are sequentially deposited in the third trench 550t.

In some embodiments, a second filling insulating film 560 filling the third trench 550t may be formed on the third connection structure 550. The second filling insulating film 560 may include, e.g., at least one of silicon oxide, aluminum oxide, tantalum oxide or their combination.

In some embodiments, a second pad 555 filling the fourth trench 555t may be formed on the third connection structure 550. The second pad 555 may include, e.g., at least one of W, Cu, Al, Au, Ag or their alloy.

In some embodiments, the first liner 253 may cover the third connection structure 550. For example, the first liner 253 may be extended along a profile of the third connection structure 550. In some embodiments, the first liner 253 may expose the second pad 555.

In some embodiments, a device separation pattern 115 may be formed in the second semiconductor substrate 220. For example, a fifth trench 115t may be formed in the second semiconductor substrate 220. The device separation pattern 115 may be formed in the fifth trench 115t.

FIG. 7 shows that the device separation pattern 115 is formed only in the periphery of the third connection structure 550 of the pad region PR but is only exemplary. For example, the device separation pattern 115 may be formed even in the periphery of the first connection structure 350 of the light-shielding region OB or of the second connection structure 450 of the connection region CR.

The device separation pattern 115 may include, e.g., at least one of silicon oxide, silicon nitride, silicon oxynitride, aluminum oxide, hafnium oxide or their combination, but is not limited thereto. In some embodiments, the device separation pattern 115 may be formed at the same level as the surface insulating layer 210.

In some embodiments, an additional color filter 370C may be formed on the first connection structure 350 and the second connection structure 450. For example, the additional color filter 370C may be formed to cover a portion of the first liner 253 in the light-shielding region OB and the connection region CR. The additional color filter 370C may include, e.g., a blue color filter, but is not limited thereto.

In some embodiments, a third passivation film 380 may be formed on the additional color filter 370C. For example, the passivation film 380 may be formed to cover a portion of the first liner 253 in the light-shielding region OB, the connection region CR, and the pad region PR. In some embodiments, the second liner 254 may be extended along a surface of the third passivation film 380. The third passivation film 380 may include, e.g., a light-transmissive resin. In some embodiments, the passivation film 380 may include the same material as that of the micro lens ML.

In some embodiments, the second liner 254 and the passivation film 380 may expose the second pad 555. For example, an exposure opening ER for exposing the second pad 555 may be formed in the second liner 254 and the passivation film 380. Therefore, the second pad 555 may be connected with the external device and configured to transmit and receive an electrical signal between the image sensor 100 and the external device according to some embodiments.

Figure 9:
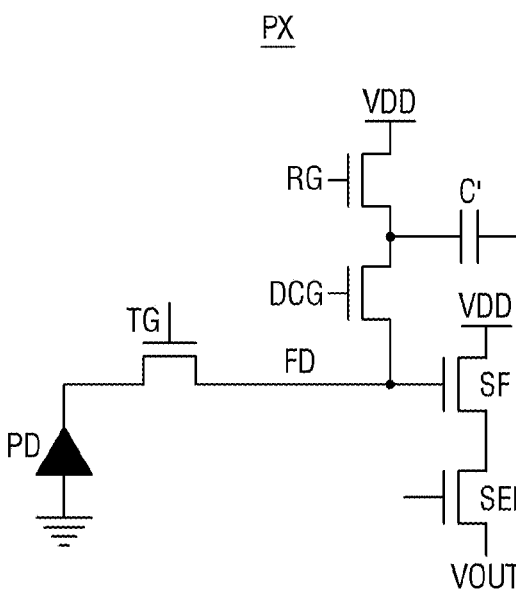
FIG. 9 is an exemplary circuit of a pixel of an image sensor according to some embodiments of the present disclosure.

FIG. 9 is an exemplary circuit view illustrating the pixel PX of the image sensor 100 according to some embodiments of the present disclosure. Hereinafter, an operation of the pixel PX of the pixel array region PA will be described with reference to FIGS. 5 to 9.

Referring to FIG. 9, the photodiode layer PD may be connected to the second transistor TR2a. A transfer gate electrode 223a_2 of the second transistor TR2a (FIG. 8) may correspond to the transfer gate TG in FIG. 9. Also, the second impurity injection region 224a (FIG. 8) may correspond to the floating diffusion FD in FIG. 9. That is, the photodiode layer PD may be electrically connected with the floating diffusion FD.

Light transmitted through the micro lens ML is incident on, e.g., enters, the photodiode layer PD, and the photodiode layer PD converts the incident light into charges. The converted charges are stored in the photodiode layer PD. The charges generated in the photodiode layer PD are transferred to the second impurity injection region 224a, which is the floating diffusion FD, through the transfer gate TG. That is, the charges generated in the photodiode layer PD are transferred to the floating diffusion FD by using the transfer gate TG, i.e., the charges generated in the photodiode layer PD may be read out through the floating diffusion FD.

The charges transferred to the floating diffusion FD are used by the source follower transistor SF and the selection transistor SEL. As a result, the selection transistor SEL output the output voltage VOUT to a column line connected to the pixel array PA. Also, the pixel PX may include a capacitor C' connected to the floating diffusion FD. The capacitor C' may be connected to the floating diffusion FD through the double conversion gate DCG. The capacitor C' may subsidiarily store the charges transferred to the floating diffusion FD. That is, the capacitor C', the storage diode, and the storage gate may be different from one another and distinguished from one another.

Figure 10:
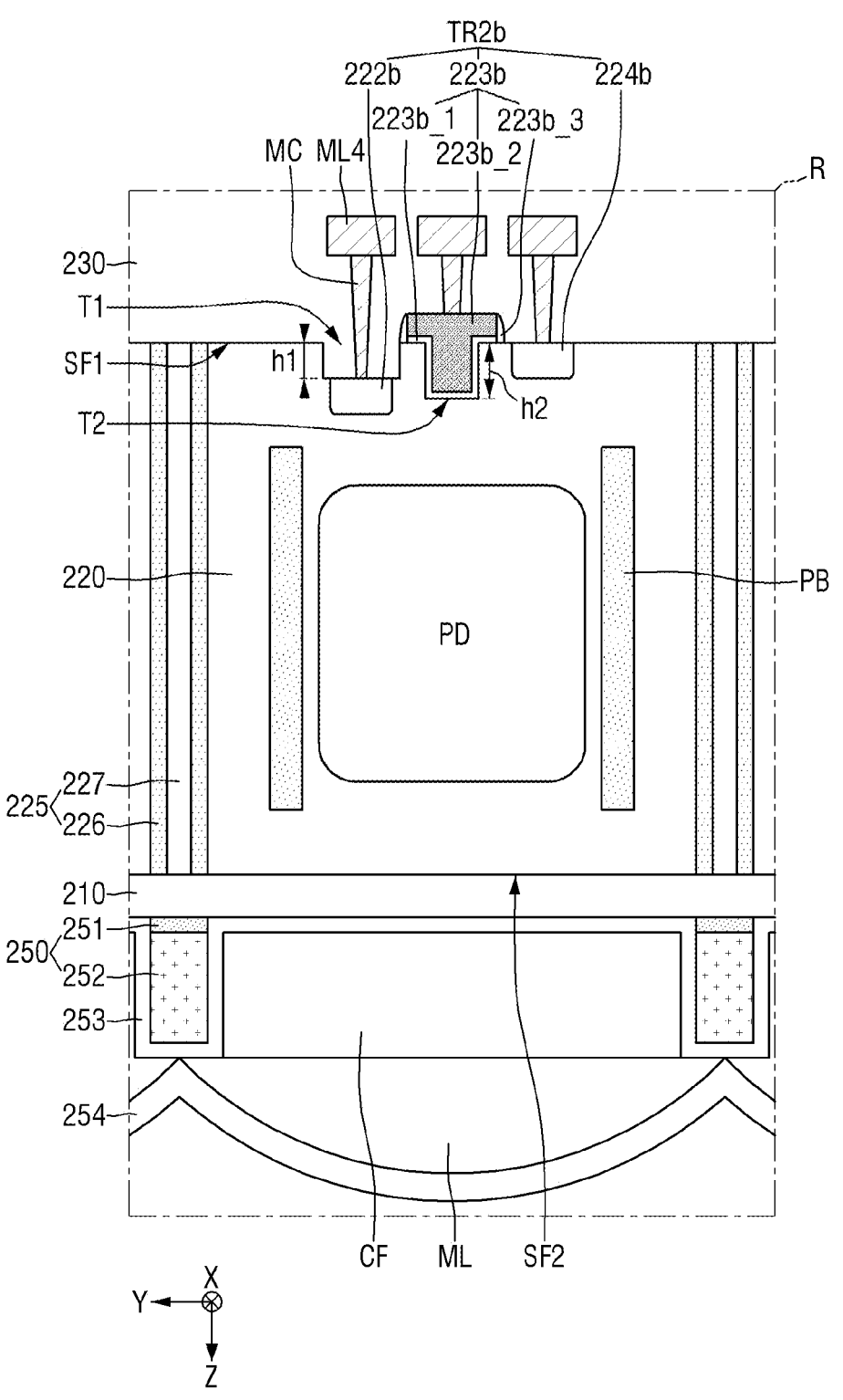
FIG. 10 is a view of an image sensor according to other embodiments of the present disclosure.

FIG. 10 is a view of an image sensor according to other embodiments of the present disclosure.

Hereinafter, a second transistor Tr2b in the pixel PX according to other embodiments of the present disclosure will be described with reference to FIG. 10. The second transistor Tr2b of FIG. 10 will be mainly described based on differences relative to the second transistor Tr2a in the pixel PX in FIG. 8.

Referring to FIG. 10, a transfer gate structure 223b is formed to fill a second trench T2 spaced apart from the first trench T1 and disposed to be adjacent to the first trench T1. The second trench T2 is formed to be recessed from the third surface SF1 of the second semiconductor substrate 220. A second depth h2 of the second trench T2 ranges from 0.4 μm to 0.5 μm. The second depth h2 of the second trench T2 is greater than the first depth h1 of the first trench T1.

A transfer gate insulating film 223$b$1 of the transfer gate structure 223$b$ is formed along a bottom surface and a sidewall of the second trench T2, and a transfer gate electrode 223$b$_2 is disposed on the transfer gate insulating film 223$b$_1 and disposed in a space defined between the transfer gate spacer 223$b$_3. The transfer gate structure 223$b$ has a Vertical Transfer Gate (VTG) structure. The transfer gate structure 223$b$ needs an additional process, e.g., as compared with a flat gate structure, but may reduce a magnitude of an electric field between the first impurity injection region 222$b$ and the transfer gate structure 223$b$ due to a small magnitude of a high voltage applied to the transfer gate electrode 223$b$_2 when the transfer gate structure operates. The reduced electric field may prevent a white spot from occurring.

Figure 11:
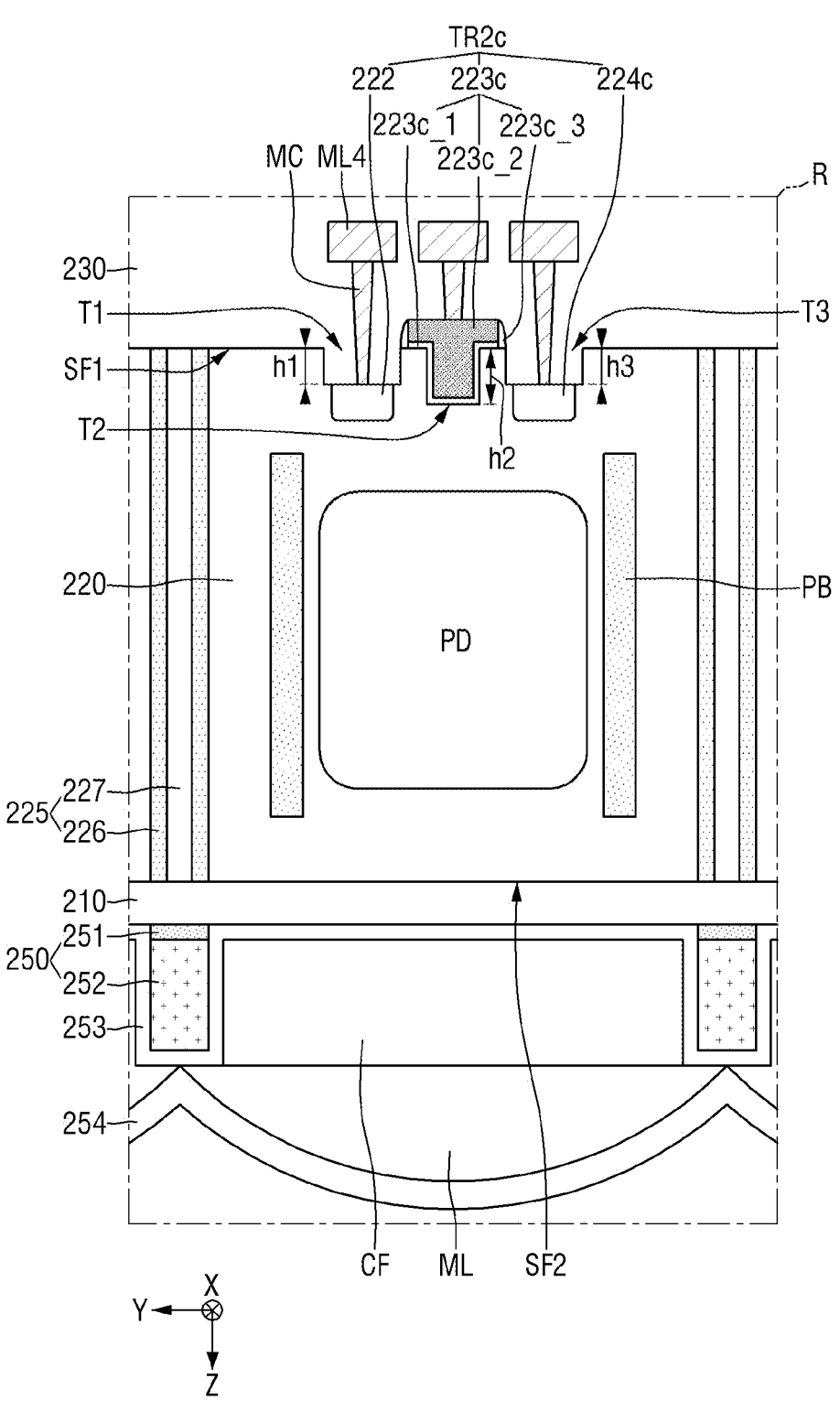
FIG. 11 is a view of an image sensor according to still other embodiments of the present disclosure.

FIG. 11 is a view of an image sensor according to still other embodiments of the present disclosure.

Hereinafter, a second transistor Tr2$c$ in the pixel PX according to still other embodiments of the present disclosure will be described with reference to FIG. 11. The second transistor Tr2$c$ of FIG. 11 will be described based on a difference relative to the second transistor Tr2$b$ in the pixel PX shown in FIG. 10.

Referring to FIG. 11, a second impurity injection region 224$c$ is formed on at least a portion of a bottom surface of a third trench T3 formed at one side of a transfer gate structure 223$c$ and recessed along the third surface SF1. The third trench T3 is disposed to be spaced apart from the first trench T1 and the second trench T2. The second impurity injection region 224$c$ is disposed at a third height h3 based on the uppermost surface of the third surface SF1, and the third height h3 of the third trench T3 may be equal to the first height h1 of the first trench T1. The transfer gate structure 223$c$ also has a Vertical Transfer Gate (VTG) structure, whereby a white spot may be prevented from occurring.

Figure 12:
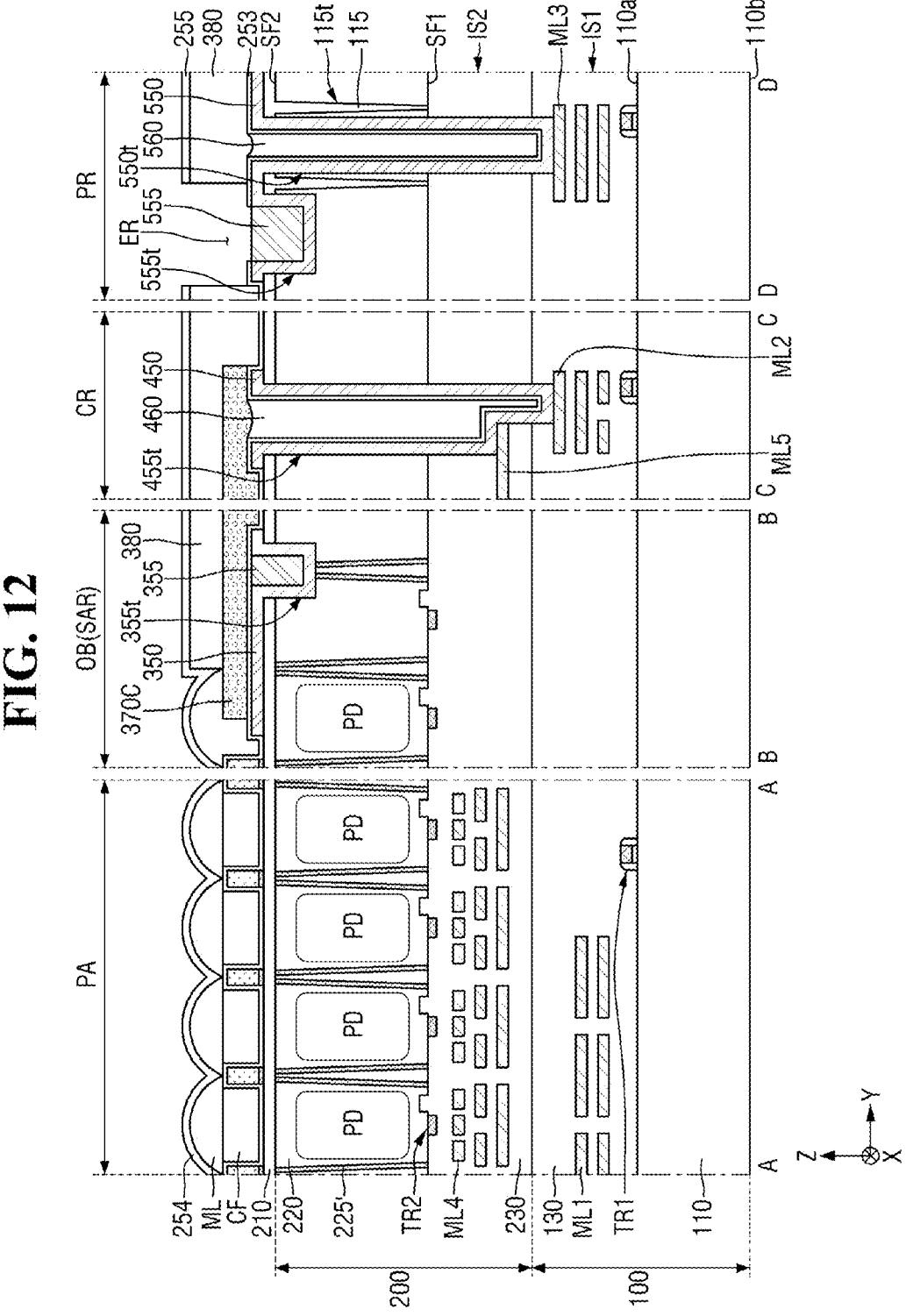
FIG. 12 is a view of an image sensor according to yet other embodiments of the present disclosure.

FIG. 12 is a view of an image sensor according to still other embodiments of the present disclosure.

Hereinafter, the image sensor according to still other embodiments of the present disclosure will be described with reference to FIG. 12. The image sensor of FIG. 12 will be described based on a difference relative to the image sensors shown in FIG. 7.

Referring to FIG. 12, in comparison with the pixel separation pattern 225 of FIG. 7, a width of a pixel separation pattern 225' is reduced from the third surface SF1 of the second semiconductor substrate 220 toward the fourth surface SF2 of the second semiconductor substrate 220. This may be caused by characteristics of an etching process for forming the pixel separation pattern 225'. For example, the process of etching the second semiconductor substrate 220 to form the pixel separation pattern 225' may be performed for the third surface SF1 of the second semiconductor substrate 220.

Figure 13:
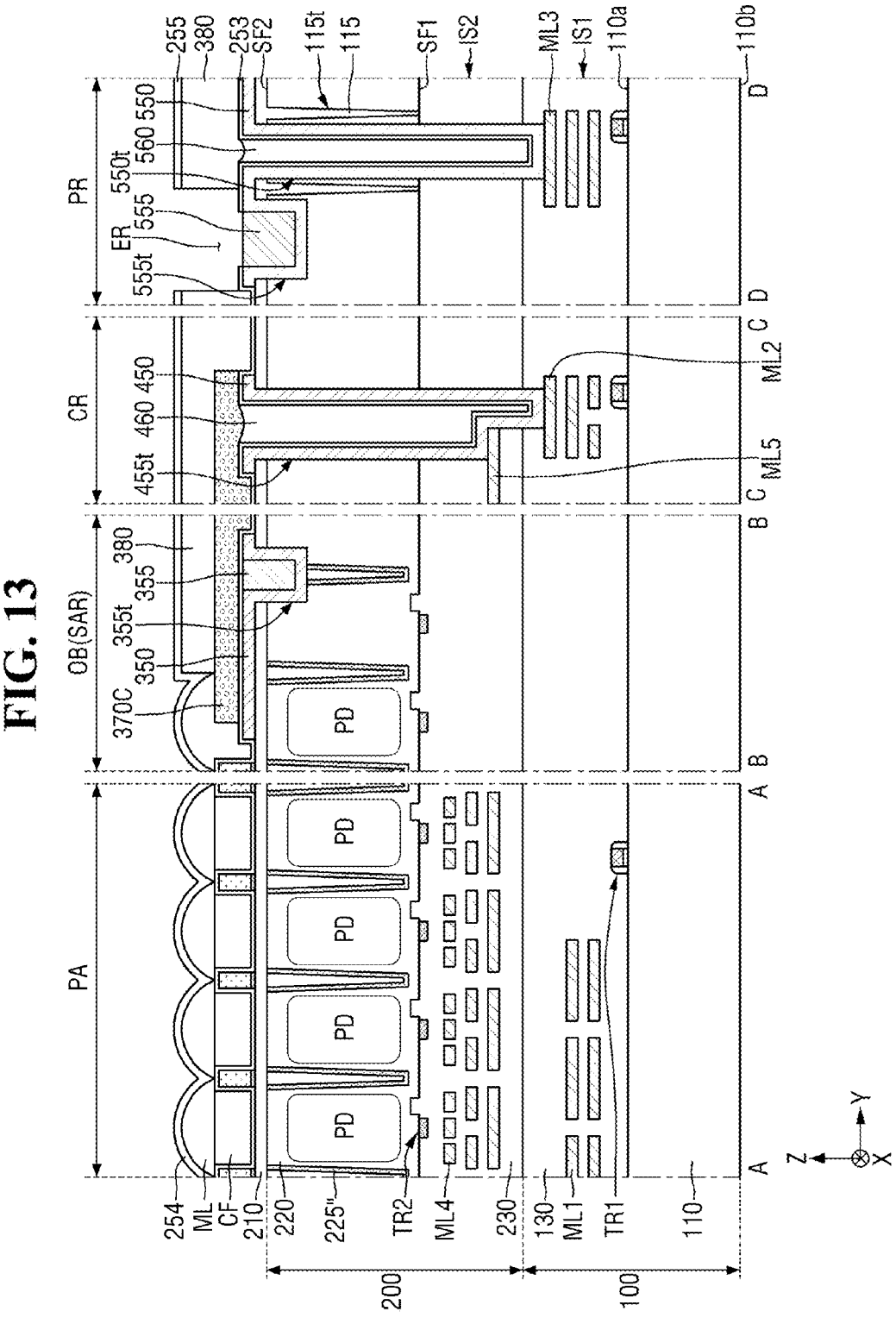
FIG. 13 is a view of an image sensor according to still other embodiments of the present disclosure.

FIG. 13 is a view of an image sensor according to yet other embodiments of the present disclosure.

Hereinafter, the image sensor according to yet other embodiments of the present disclosure will be described with reference to FIG. 13. The image sensor of FIG. 13 will be described based on a difference relative to the image sensors shown in FIG. 12.

Referring to FIG. 13, in comparison with the pixel separation pattern 225' of FIG. 12, a width of a pixel separation pattern 225" is reduced from the fourth surface SF2 of the second semiconductor substrate 220 toward the third surface SF1 of the second semiconductor substrate 220. This may be caused by characteristics of an etching process for forming the pixel separation pattern 225". For example, the process of etching the second semiconductor substrate 220 to form the pixel separation pattern 225" may be performed for the fourth surface SF2 of the second semiconductor substrate 220.

In some embodiments, the pixel separation pattern 225" may not completely pass through the second semiconductor substrate 220. For example, the pixel separation pattern 225" is extended from the fourth surface SF2 of the second semiconductor substrate 220 but may not be extended to the third surface SF1 of the second semiconductor substrate 220. That is, the lowest surface of the pixel separation pattern 225" may be spaced apart from the third surface SF1 of the second semiconductor substrate 220.

Figure 14:
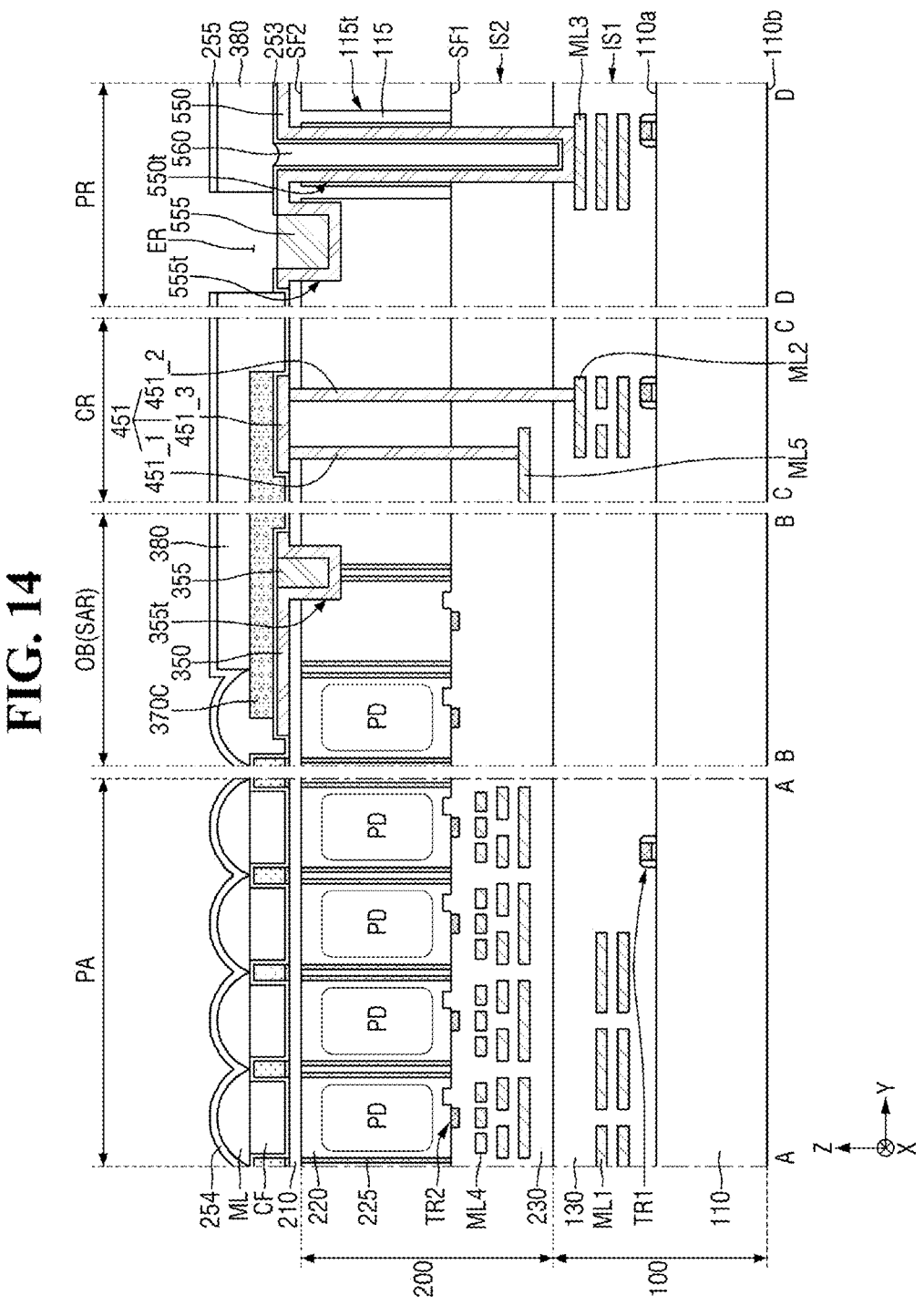
FIG. 14 is a view of an image sensor according to yet other embodiments of the present disclosure.

FIG. 14 is a view of an image sensor according to still other embodiments of the present disclosure.

Hereinafter, the image sensor according to still other embodiments of the present disclosure will be described with reference to FIG. 14. The image sensor of FIG. 14 will be described based on a difference relative to the image sensors shown in FIG. 7.

Referring to FIG. 14, the image sensor according to some embodiments may include a connection pattern 451 instead of the second connection structure 450 in the connection region CR. The connection pattern 451 may include a first connection pattern 451_1, a second connection pattern 451_2, and a third connection pattern 451_3.

The first connection pattern 451_1 may pass through the surface insulating layer 210, the second semiconductor substrate 220, and the second inter-line insulating film 230 in the third direction Z, and may be connected with the fifth line ML5 in the connection region CR. The second connection pattern 451_2 may pass through the surface insulating layer 210, the second semiconductor substrate 220, the second inter-line insulating film 230, and the first inter-line insulating film 130 in the third direction Z, and may be connected with the second line ML2 in the connection region CR. The second connection pattern 451_2 may be spaced apart from the first connection pattern 451_1. The surface insulating layer 210, the second semiconductor substrate 220, and the second inter-line insulating film 230 may be disposed between the first connection pattern 451_1 and the second connection pattern 451_2. The third connection pattern 451_3 may be disposed on an upper surface of the surface insulating layer 210. The third connection pattern 451_3 may connect the first connection pattern 451_1 with the second connection pattern 451_2.

Figure 15:
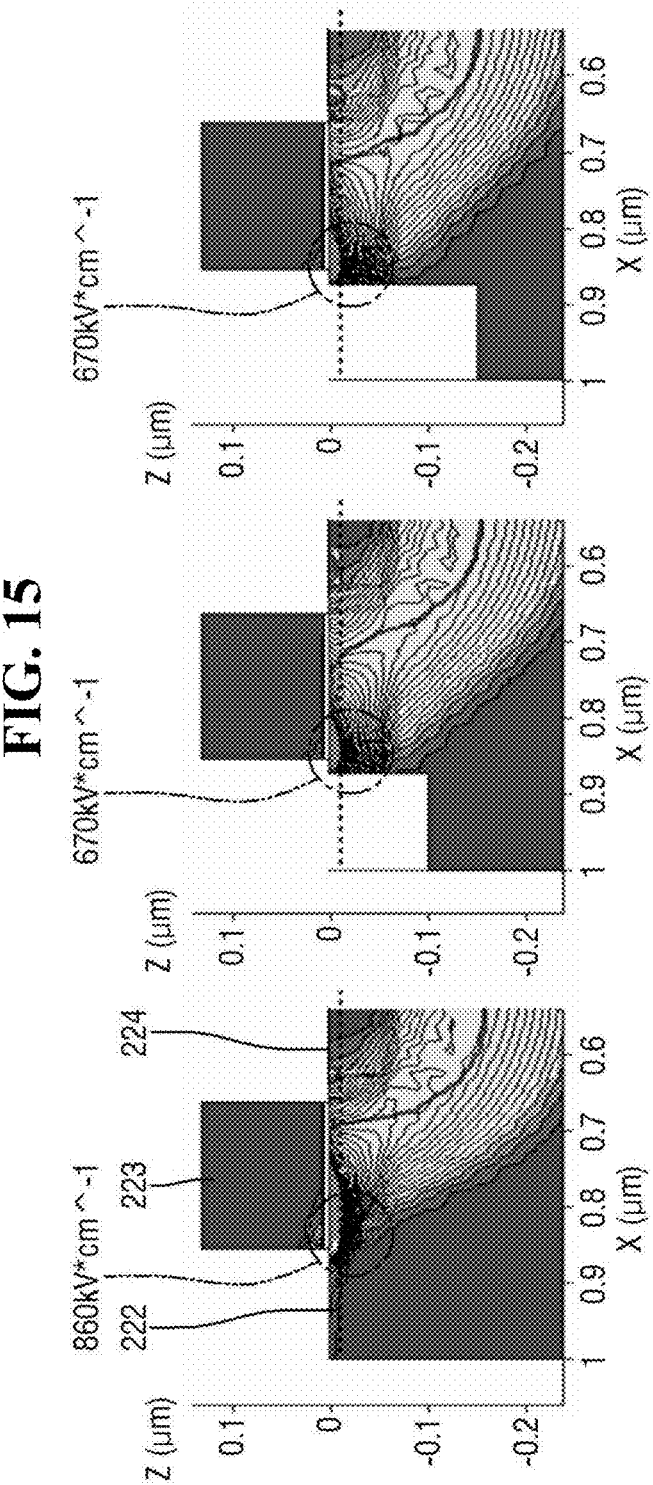
FIG. 15 is a graph of an effect of an image sensor according to some embodiments of the present disclosure.

FIG. 15 is a graph of an effect of an image sensor according to some embodiments of the present disclosure. FIG. 15 shows an electric field between a first impurity injection region 222 and the transfer gate structure 223 in accordance with a change of the first height h1 of the first trench T1.

Referring to FIG. 15, when the first trench T1 is not formed and the first impurity injection region 222 is formed on the uppermost surface of the third surface SF1 of the second semiconductor substrate 220, an electric field having a magnitude of 860 kV*cm^−1 is formed between the first impurity injection region 222 and the transfer gate structure 223. When the first height h1 of the first trench T1 is 0.1 μm and the first impurity injection region 222 is formed on at least a portion of the bottom surface of the first trench T1, an electric field having a magnitude of 670 kV*cm^−1 is formed between the first impurity injection region 222 and the transfer gate structure 223. When the first height h1 of the first trench T1 is 0.15 μm and the first impurity injection region 222 is formed on at least a portion of the bottom surface of the first trench T1, an electric field having a magnitude of 670 kV*cm^-1 is formed between the first impurity injection region 222 and the transfer gate structure 223.

Referring to FIG. 15, when the first impurity injection region 222 is formed on at least a portion of the bottom surface of the first trench T1, an electric field magnitude between the first impurity injection region 222 and the transfer gate structure 223 is reduced, and occurrence of tunneling between the first impurity injection region 222 and the transfer gate structure 223 is reduced in accordance with the reduced electric field magnitude, whereby occurrence of a white spot is also reduced. Also, referring to FIG. 15, when the first height h1 ranges from 0.1 μm to 0.2 μm, performance degradation of the image sensor may efficiently be avoided.

Figure 16:
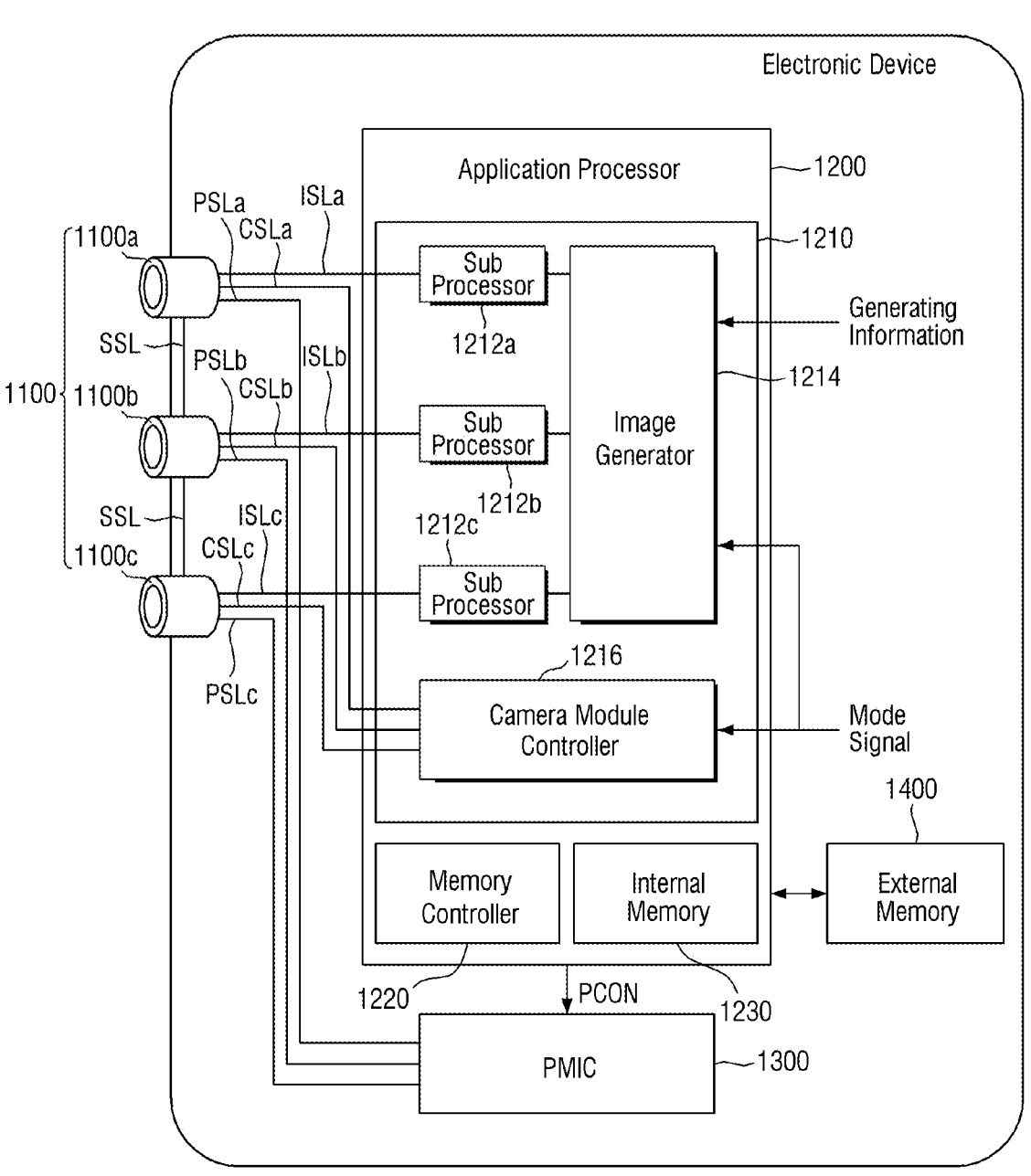
FIG. 16 is a block view of an electronic device including a multi-camera module according to some embodiments of the present disclosure.
Figure 17:
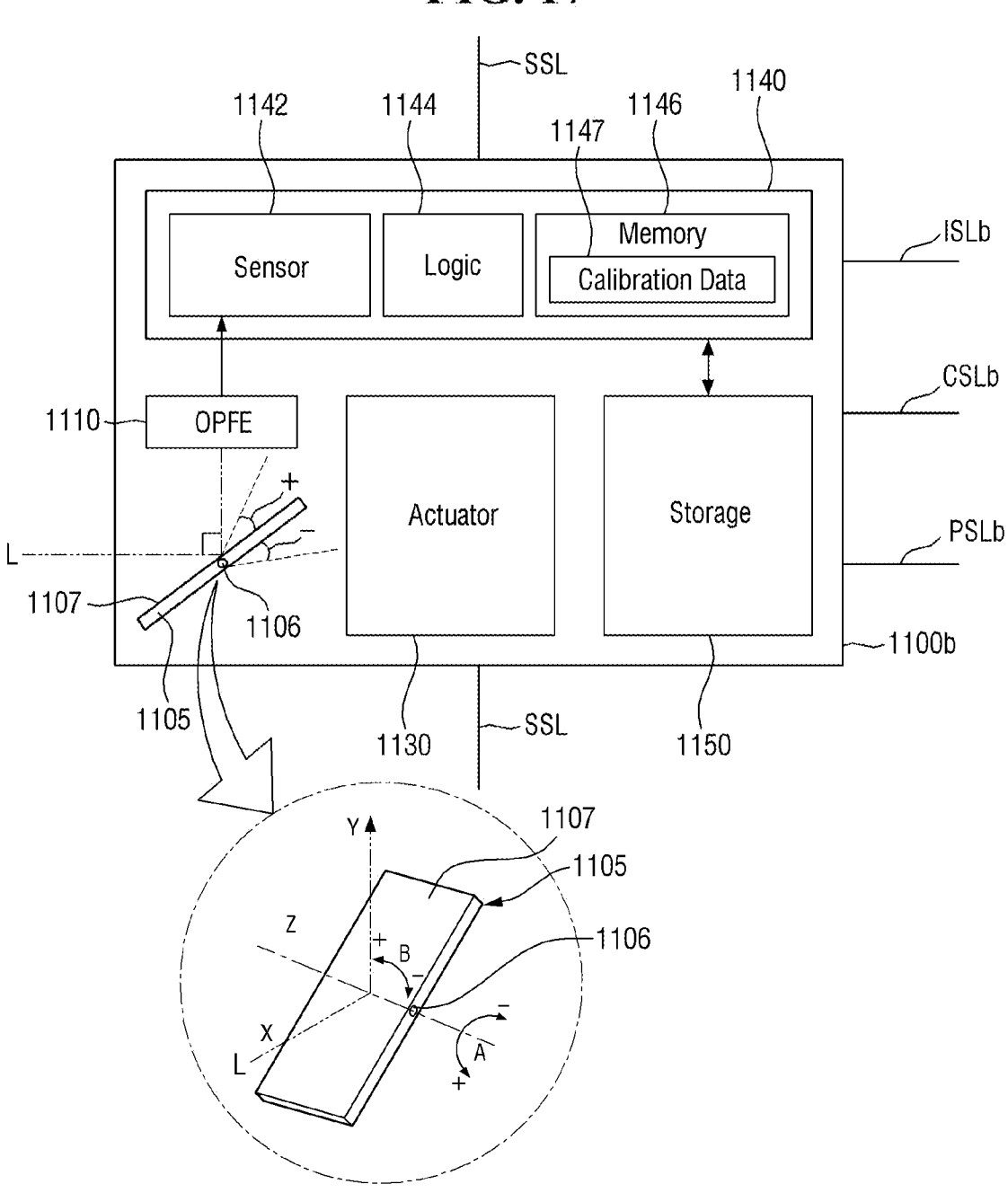
FIG. 17 is a detailed block view of the camera module of FIG. 16.

FIG. 16 is a block view of an electronic device that includes a multi-camera module, and FIG. 17 is a detailed block view of the camera module of FIG. 16.

Hereinafter, an electronic device 1000 according to some embodiments will be described with reference to FIGS. 16 and 17. For convenience of description, a portion repeated with the description of FIGS. 1 to 15 will be described only briefly or omitted.

Referring to FIG. 16, the electronic device 1000 may include a camera module group 1100, an application processor 1200, a power management integrated circuit (PMIC) 1300, and an external memory 1400.

The camera module group 1100 may include a plurality of camera modules 1100a, 1100b and 1100c. Although the drawing shows an embodiment in which three camera modules 1100a, 1100b and 1100c are disposed, the embodiments are not limited to this example. For example, the camera module group 1100 may be carried out by being modified to include only two camera modules. In another example, the camera module group 1100 may be carried out by being modified to include n number of camera modules (n is a natural number of 4 or more). In this case, one of the three camera modules 1100a, 1100b, and 1100c may include the image sensor 100 described with reference to FIGS. 1 to 15.

Hereinafter, a detailed configuration of the camera module 1100b will be described with reference to FIG. 17, but the following description may equally be applied to the other camera modules 1100a and 1100c in accordance with the embodiment.

Referring to FIG. 17, the camera module 1100b may include a prism 1105, an Optical Path Folding Element (hereinafter, "OPFE") 1110, an actuator 1130, an image sensing device 1140, and a storage 1150.

The prism 1105 may include a reflective surface 1107 of a light-reflective material to deform a path of externally incident light L.

In some embodiments, the prism 1105 may change a path of incident light L in the first direction X to the second direction Y vertical to the first direction X. Also, the prism 1105 may rotate the reflective surface 1107 of the light-reflective material in a direction A based on a central axis 1106 or change the path of the incident light L in the first direction X to the second direction Y by rotating the central axis 1106 in a direction B. At this time, the OPFE 1110 may also move to the third direction Z vertical to the first direction X and the second direction Y.

In some embodiments, as shown, a maximum rotation angle of the prism 1105 in a direction of plus(+) A is 15 degrees or less, and a maximum rotation angle of the prism 1105 in a direction of minus (−) A may be greater than 15 degrees, but the embodiments are not limited thereto.

In some embodiments, the prism 1105 may move at 20 degrees or so, between 10 degrees and 20 degrees or between 15 degrees and 20 degrees in a direction of plus(+) or minus(−) B. In this case, the moving angle may be equal in the direction of plus(+) or minus(−) B, or may be almost similar in the range of 1 degree or so.

In some embodiments, the prism 1105 may move the reflective surface 1107 of the light-reflective material to the third direction Z parallel with an extension direction of the central axis 1106.

The OPFE 1110 may include an optical lens having, e.g., m number of groups (m is a natural number). The m number of lenses may move in the second direction Y and change an optical zoom ratio of the camera module 1100b. For example, assuming that a basic optical zoom ratio of the camera module 1100b is z, when m number of optical lenses included in the OPFE 1110 move, the optical zoom ratio of the camera module 1100b may be changed to an optical zoom ratio of 3Z, 5Z, or 5Z or more.

The actuator 1130 may move the OPFE 1110 or optical lens (hereinafter, referred to as optical lens) to a specific position. For example, the actuator 1130 may adjust a position of the optical lens such that an image sensor 1142 may be positioned at a focal length of the optical lens for exact sensing.

The image sensing device 1140 may include the image sensor 1142, a control logic 1144, and a memory 1146. The image sensor 1142 may sense an image of a sensing target by using light L provided through the optical lens. The control logic 1144 may control an overall operation of the camera module 1100b. For example, the control logic 1144 may control the operation of the camera module 1100b in accordance with a control signal provided through a control signal line CSLb.

The memory 1146 may store information, which is required for the operation of the camera module 1100b, such as calibration data 1147. The calibration data 1147 may include information required for the camera module 1100b to generate image data by using light L provided from the outside. The calibration data 1147 may include, e.g., information on the aforementioned degree of rotation, information on a focal length, and information on an optical axis. When the camera module 1100b is implemented in the form of a multi-state camera of which focal length is varied depending on the position of the optical lens, the calibration data 1147 may include a focal length value per position (or per state) of the optical lens and information related to auto focusing.

The storage 1150 may store the image data sensed through the image sensor 1142. The storage 1150 may be disposed outside the image sensing device 1140, and may be implemented to be stacked with a sensor chip constituting the image sensing device 1140. In some embodiments, the storage 1150 may be implemented as an Electrically Erasable Programmable Read-Only Memory (EEPROM), but the embodiments are not limited thereto.

Referring to FIGS. 16 and 17 together, in some embodiments, each of the plurality of camera modules 1100a, 1100b and 1100c may include the actuator 1130. Therefore, each of the plurality of camera modules 1100a, 1100b and 1100c may include calibration data 1147 equal to or different from one another based on the operation of the actuator 1130 included therein.

In some embodiments, one of the plurality of camera modules 1100a, 1100b and 1100c (e.g., the camera module 1100b) may be a folded lens type camera module that includes the aforementioned prism 1105 and OPFE 1110, and the other camera modules (e.g., the camera modules 1100a and 1100c) may be vertical type camera modules that do not include the prism 1105 and the OPFE 1110, but embodiments are not limited thereto.

In some embodiments, one of the plurality of camera modules 1100a, 1100b and 1100c (e.g., the camera module 1100c) may be a vertical type depth camera that extracts depth information by using, e.g., infrared ray (IR). In this case, the application processor 1200 may generate a 3D depth image by merging image data provided from the depth camera with image data provided from the other camera module (e.g., camera modules 1100a or 1100b).

In some embodiments, at least two of the plurality of camera modules 1100a, 1100b and 1100c (e.g., the camera modules 1100a and 1100b) may have their respective field of views (viewing angles) different from each other. In this case, at least two of the plurality of camera modules 1100a, 1100b and 1100c (e.g., the camera modules 1100a and 1100b) have their respective optical lenses different from each other, but are not limited thereto.

Also, in some embodiments, the viewing angles of the plurality of camera modules 1100a, 1100b and 1100c may be different from one another. In this case, the optical lenses respectively included in the plurality of camera modules 1100a, 1100b and 1100c may be different from one another but are not limited thereto.

In some embodiments, the plurality of camera modules 1100a, 1100b and 1100c may be disposed to be physically spaced apart from one another. That is, rather than using one image sensor 1142 commonly by the plurality of camera modules 1100a, 1100b and 1100c by dividing a sensing region of the image sensor 1142, the image sensor 1142 may independently be disposed in each of the plurality of camera modules 1100a, 1100b and 1100c.

Referring to FIG. 16 again, the application processor 1200 may include an image processing device 1210, a memory controller 1220, and an internal memory 1230. The application processor 1200 may be implemented to be spaced apart from the plurality of camera modules 1100a, 1100b and 1100c. For example, the application processor 1200 and the plurality of camera modules 1100a, 1100b and 1100c may be implemented to be spaced apart from each other by a separate semiconductor chip.

The image processing device 1210 may include a plurality of sub image processors 1212a, 1212b and 1212c, an image generator 1214, and a camera module controller 1216. The image processing device 1210 may include the number of a plurality of sub image processors 1212a, 1212b and 1212c corresponding to the number of the plurality of camera modules 1100a, 1100b and 1100c.

The image data respectively generated from the camera modules 1100a, 1100b and 1100c may be provided to their corresponding sub image processors 1212a, 1212b and 1212c through image signal lines ISLa, ISLb and ISLc spaced apart from one another. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed using, e.g., a Camera Serial Interface (CSI) based on a Mobile Industry Processor Interface (MIPI), but the embodiments are not limited thereto.

Meanwhile, in some embodiments, one sub image processor may be disposed to correspond to the plurality of camera modules. For example, the sub image processor 1212a and the sub image processor 1212c may be implemented to be combined as one sub image processor without being spaced apart from each other as shown, and the image data provided from the camera module 1100a and the camera module 1100c may be selected through a selection element (e.g., multiplexer), etc. and then may be provided to the combined sub image processor.

The image data provided to each of the sub image processors 1212a, 1212b and 1212c may be provided to the image generator 1214. The image generator 1214 may generate an output image by using the image data provided from each of the sub image processors 1212a, 1212b and 1212c in accordance with image generating information or a mode signal.

In detail, the image generator 1214 may generate an output image by merging at least a portion of the image data generated from the camera modules 1100a, 1100b and 1100c having their respective viewing angles different from one another, in accordance with the image generating information or the mode signal. Also, the image generator 1214 may select any one of the image data generated from the camera modules 1100a, 1100b and 1100c having their respective viewing angles different from one another to generate the output image in accordance with the image generating information or the mode signal.

In some embodiments, the image generating information may include a zoom signal or a zoom factor. Also, in some embodiments, the mode signal may be, e.g., a signal based on a mode selected from a user.

When the image generating information is a zoom signal (zoom factor) and the camera modules 1100a, 1100b and 1100c have their respective field of views (viewing angles) different from another, the image generator 1214 may perform different operations in accordance with a type of the zoom signal. For example, when the zoom signal is a first signal, the image data output from the camera module 1100a and the image data output from the camera module 1100c may be merged with each other and then an output image may be generated using the merged image signal and the image data output from the camera module 1100b, which is not used for merge. When the zoom signal is a second signal different from the first signal, the image generator 1214 may select any one of the image data output from the camera modules 1100a, 1100b and 1100c to output the output image without performing such image data merge. However, the embodiments are not limited to this case, and the method for processing the image data may be carried out by being modified at any time if necessary.

In some embodiments, the image generator 1214 may receive a plurality of image data of which exposure timings are different from one another, from at least one of the plurality of sub image processors 1212a, 1212b and 1212c, and may perform high dynamic range (HDR) processing for the plurality of image data to generate merged image data with an increased dynamic range.

The camera module controller 1216 may provide control signal to each of the camera modules 1100a, 1100b and 1100c. The control signals generated from the camera module controller 1216 may be provided to their corresponding camera modules 1100a, 1100b and 1100c through control signal lines CSLa, CSLb and CSLc spaced apart from one another.

Any one of the plurality of camera modules 1100a, 1100b and 1100c may be designated as a master camera (e.g. camera module 1100b) in accordance with the image generating information including a zoom signal or the mode signal, and the other camera modules (e.g., camera modules 1100a and 1100c) may be designated as slave cameras. This information may be included in the control signals and then provided to the corresponding camera modules 1100a, 1100b and 1100c through the control signal lines CSLa, CSLb and CSLc spaced apart from one another.

The camera modules operating as the master or slave cameras may be changed in accordance with the zoom factor or operation mode signal. For example, when a viewing angle of the camera module 1100a is wider than that of the camera module 1100b and the zoom factor indicates a low zoom ratio, the camera module 1100b may operate as a master camera, and the camera module 1100a may operate as a slave camera. On the contrary, when the zoom factor indicates a high zoom ratio, the camera module 1100a may operate as a master camera and the camera module 1100b may operate as a slave camera.

In some embodiments, the control signal provided from the camera module controller 1216 to each of the camera modules 1100a, 1100b and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b that has received the sync enable signal may generate a sync signal based on the sync enable signal and provide the generated sync signal to the camera modules 1100a and 1100c through a sync signal line SSL. The camera module 1100b and the camera modules 1100a and 1100c may be synchronized with the sync signal and transmit the image data to the application processor 1200.

In some embodiments, the control signals provided from the camera module controller 1216 to the plurality of camera modules 1100a, 1100b and 1100c may include mode information based on a mode signal. Based on the mode information, the plurality of camera modules 1100a, 1100b and 1100c may operate in a first operation mode and a second operation mode regarding a sensing speed.

In the first operation mode, the plurality of camera modules 1100a, 1100b and 1100c may generate an image signal at a first speed (e.g., generate an image signal of a first frame rate), encode the generated image signal at a second speed higher than the first speed (e.g., encode an image signal of a second frame rate higher than the first frame rate), and transmit the encoded image signal to the application processor 1200. At this time, the second speed may be 30 times or less of the first speed.

The application processor 1200 may store the received image signal, i.e., the encoded image signal in the internal memory 1230 or the storage 1400 outside the application processor 1200. Afterwards, the application processor 1200 may read out and decode the encoded image signal from the memory 1230 or the storage 1400 and display image data generated based on the decoded image signal. For example, a corresponding one of the plurality of sub image processors 1212a, 1212b and 1212c of the image processing device 1210 may perform decoding, and may also perform image processing for the decoded image signal.

In the second operation mode, the plurality of camera modules 1100a, 1100b and 1100c may generate an image signal at a third speed lower than the first speed (e.g., generate an image signal of a third frame rate lower than the first frame rate) and transmit the generated image signal to the application processor 1200. The image signal provided to the application processor 1200 may be a signal that is not encoded. The application processor 1200 may perform image processing for the received image signal or store the image signal in the memory 1230 or the storage 1400.

The PMIC 1300 may supply a power, e.g., a power voltage, to each of the plurality of camera modules 1100a, 1100b and 1100c. For example, the PMIC 1300 may supply a first power to the camera module 1100a through a power signal line PSLa, supply a second power to the camera module 1100b through a power signal line PSLb and supply a third power to the camera module 1100c through a power signal line PSLc, under the control of the application processor 1200.

The PMIC 1300 may generate a power corresponding to each of the plurality of camera modules 1100a, 1100b and 1100c or adjust a level of the power in response to a power control signal PCON from the application processor 1200. The power control signal PCON may include a power adjustment signal per operation mode of the plurality of camera modules 1100a, 1100b and 1100c. For example, the operation mode may include a lower power mode. At this time, the power control signal PCON may include information on a camera module operating in a lower power mode and a power level that is set. Levels of the powers respectively provided to the plurality of camera modules 1100a, 1100b and 1100c may be equal to or different from one another. Also, the level of the power may dynamically be changed.

By way of summation and review, demand for miniaturization of a pitch of pixels has been increased with the development of the computer and communication industries. However, miniaturization of pixels may increase the magnitude of an electric field (E-field) between elements in the pixel, thereby degrading product performance. Therefore, embodiments provide an image sensor that reduces an electric field between a transfer gate and an impurity injection region to avoid degradation, e.g., avoid occurrence of a white spot. Embodiments also provide an image sensing system that reduces an electric field between a transfer gate and an impurity injection region to avoid degradation such as occurrence of a white spot.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An image sensor, comprising:
a substrate including a first surface and a second surface opposing the first surface;
a pixel array region in the substrate;
a first photodiode layer and a second photodiode layer in the pixel array region;
a first separation trench between the first photodiode layer and the second photodiode layer;
a transfer gate;

a first trench recessed from the first surface of the substrate in the pixel array region and overlapping with the first photodiode layer in a first direction perpendicular to the first surface of the substrate;

a first P type impurity injection region on a bottom surface of the first trench;

a first contact connected to the bottom surface of the first trench and vertically overlapping with the bottom surface of the first trench; and a lens on the second surface of the substrate, wherein the first contact extends in the first direction, wherein a distance from the second surface of the substrate to the bottom surface of the first trench in the first direction is shorter than a distance from the second surface of the substrate to an uppermost surface of the first surface of the substrate, and wherein at least a portion of the transfer gate is on the uppermost surface of the first surface of the substrate.

2. The image sensor of claim 1, wherein a distance from the uppermost surface of the first surface of the substrate to the bottom surface of the first trench in the first direction is from about 0.1 μm to about 0.2 μm.

3. The image sensor of claim 1, wherein the first p type impurity injection region is connected with a ground terminal.

4. The image sensor of claim 3, wherein the first contact comprises a first surface and a second surface opposing the first surface of the first contact, and wherein the first surface of the first contact is disposed in the first trench in a vertical view.

5. The image sensor of claim 4, further comprises a second contact comprises a first surface and a second surface opposing the first surface of the second contact, wherein the second contact is connected to the transfer gate and vertically overlapping with the transfer gate in the first direction, wherein a length of the first contact from the first surface of the first contact to the second surface of the first contact is longer than a length of the second contact from the first surface of the second contact to the second surface of the second contact.

6. The image sensor of claim 5, further comprises a floating diffusion in the substrate, a dual conversion gate, and a reset transistor, wherein the floating diffusion, the dual conversion gate, and the reset transistor are connected in series.

7. The image sensor of claim 5, wherein the substrate further comprises a light-shielding region, wherein the light-shielding region comprises a third trench recessed from the first surface of the substrate and a second p type impurity injection region, wherein the second p type impurity injection region is on a bottom surface of the third trench.

8. The image sensor of claim 5, wherein the first separation trench penetrates at least a part of the substrate from the first surface of the substrate.

9. The image sensor of claim 5, further comprises a first N type impurity injection region on the uppermost surface of the first surface of the substrate and a third contact connecting to the first N type impurity injection region, and wherein the length of the first contact from the first surface of the first contact to the second surface of the first contact is longer than a length of the third contact from the first surface of the third contact to the second surface of the third contact.

10. The image sensor of claim 7, further comprises a first N type impurity injection region on the uppermost surface of the first surface of the substrate in the light-shielding region.

11. The image sensor of claim 10, further comprises a third contact connecting to the first N type impurity injection region, and wherein the length of the second contact from the first surface of the second contact to the second surface of the second contact is shorter than a length of the third contact from the first surface of the third contact to the second surface of the third contact.

12. The image sensor of claim 11, wherein the height of the first contact in the first direction is equal to the height of the third contact in the first direction.

13. An image sensor, comprising:

a substrate including a first surface and a second surface opposing the first surface;

a pixel array region in the substrate;

a first photodiode layer and a second photodiode layer in the pixel array region;

a first separation trench between the first photodiode layer and the second photodiode layer;

a transfer gate;

a first trench recessed from the first surface of the substrate in the pixel array region and overlapping with the first photodiode layer in a first direction perpendicular to the first surface of the substrate;

a first impurity injection region on a bottom surface of the first trench;

a first contact connected to the bottom surface of the first trench and vertically overlapping with the bottom surface of the first trench; and a lens on the second surface of the substrate, wherein the first contact extends in the first direction, wherein a distance from the second surface of the substrate to the bottom surface of the first trench in the first direction is shorter than a distance from the second surface of the substrate to an uppermost surface of the first surface of the substrate, and wherein at least a portion of the transfer gate is on the uppermost surface of the first surface of the substrate.

14. The image sensor of claim 13, wherein the first contact comprises a first surface and a second surface opposing the first surface of the first contact, and wherein the first surface of the first contact is disposed in the first trench in a vertical view.

15. The image sensor of claim 14, further comprises a second contact comprises a first surface and a second surface opposing the first surface of the second contact, wherein the second contact is connected to the transfer gate and vertically overlapping with the transfer gate in the first direction, wherein a length of the first contact from the first surface of the first contact to the second surface of the first contact is longer than a length of the second contact from the first surface of the second contact to the second surface of the second contact.

16. The image sensor of claim 15, wherein the first separation trench penetrates at least a part of the substrate from the first surface of the substrate.

17. The image sensor of claim 15, further comprises a second impurity injection region on the uppermost surface of the first surface of the substrate and a third contact connecting to the second impurity injection region, wherein the length of the first contact from the first surface of the first contact to the second surface of the first contact is longer than a length of the third contact from the first surface of the third contact to the second surface of the third contact, and wherein the first impurity injection region is doped with a first type impurities and the second impurity injection region is doped with a second type impurities different from the first type impurities.

18. The image sensor of claim 15, wherein the first impurity injection region is doped with P type impurities.

19. The image sensor of claim 17, wherein the first impurity injection region is doped with P type impurities and the second impurity injection region is doped with N type impurities.

20. An image sensor, comprising:

a substrate including a first surface and a second surface opposing the first surface;

a pixel array region in the substrate;

a first photodiode layer and a second photodiode layer in the pixel array region;

a first separation trench between the first photodiode layer and the second photodiode layer;

a transfer gate;

a first trench recessed from the first surface of the substrate in the pixel array region and overlapping with the first photodiode layer in a first direction perpendicular to the first surface of the substrate;

a P type impurity injection region on a bottom surface of the first trench;

a first contact connected to the bottom surface of the first trench and vertically overlapping with the bottom surface of the first trench; and a lens on the second surface of the substrate, wherein a distance from the second surface of the substrate to the bottom surface of the first trench in the first direction is shorter than a distance from the second surface of the substrate to an uppermost surface of the first surface of the substrate, and wherein at least a portion of the transfer gate is on the uppermost surface of the first surface of the substrate.

* * * * *